US012757513B2

(12) United States Patent
Noda et al.

(10) Patent No.: US 12,757,513 B2
(45) Date of Patent: Oct. 6, 2026

(54) SOLID-STATE IMAGING DEVICE AND IMAGING APPARATUS

(71) Applicant: SONY SEMICONDUCTOR SOLUTIONS CORPORATION, Kanagawa (JP)

(72) Inventors: Yuki Noda, Nagasaki (JP); Yusuke Murakawa, Nagasaki (JP); Takuya Hanada, Nagasaki (JP); Makoto Nakamura, Nagasaki (JP); Koya Tsuchimoto, Nagasaki (JP); Shin Kitano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 759 days.

(21) Appl. No.: 17/794,034

(22) PCT Filed: Jan. 22, 2021

(86) PCT No.: PCT/JP2021/002230

§ 371 (c)(1),
(2) Date: Jul. 20, 2022

(87) PCT Pub. No.: WO2021/157386

PCT Pub. Date: Aug. 12, 2021

(65) Prior Publication Data

US 2023/0052364 A1 Feb. 16, 2023

(30) Foreign Application Priority Data

Feb. 3, 2020 (JP) ................................ 2020-016454

(51) Int. Cl.
*H10F 39/00* (2025.01)
*H04N 25/50* (2023.01)
(Continued)

(52) U.S. Cl.
CPC .......... *H10F 39/811* (2025.01); *H04N 25/50* (2023.01); *H05K 1/181* (2013.01); *H10F 39/18* (2025.01); *H05K 2201/10151* (2013.01)

(58) Field of Classification Search
None
See application file for complete search history.

(56) References Cited

U.S. PATENT DOCUMENTS 10,950,578 B2 * 3/2021 Lee .................... H10W 20/023
2010/0177226 A1 7/2010 Itonaga et al.
(Continued)

FOREIGN PATENT DOCUMENTS

CN 109729292 A 5/2019
CN 110445960 A 11/2019
(Continued)

OTHER PUBLICATIONS

International Search Report and Written Opinion prepared by the Japan Patent Office on Mar. 22, 2021, for International Application No. PCT/JP2021/002230, 2 pgs.

*Primary Examiner* — Nishath Yasmeen
(74) *Attorney, Agent, or Firm* — XSENSUS, LLP

(57) ABSTRACT

A solid-state imaging device according to the present disclosure includes a light-receiving substrate, a circuit board, and a plurality of first connections. The light-receiving substrate includes a plurality of light-receiving circuits provided with photoelectric conversion elements. The circuit board is directly bonded to the light-receiving substrate and includes a plurality of address event detection circuits that detects individual changes in voltages output from the photoelectric conversion elements of the plurality of light-receiving circuits. The plurality of first connections is provided at a joint between the light-receiving substrate and the circuit board to electrically connect the light-receiving cir-
(Continued)

cuits and the address event detection circuits corresponding to each other.

10 Claims, 18 Drawing Sheets

(51) Int. Cl.
*H05K 1/181* (2026.01)
*H10F 39/18* (2025.01)

(56) References Cited

U.S. PATENT DOCUMENTS

| | | | | |
|---|---|---|---|---|
| 2014/0322863 | A1* | 10/2014 | Lin | H10W 72/072<br>438/107 |
| 2017/0111547 | A1* | 4/2017 | Otani | H04N 1/6038 |
| 2018/0152644 | A1* | 5/2018 | Kondo | H10F 39/8027 |
| 2018/0167575 | A1 | 6/2018 | Watanabe et al. | |
| 2018/0366445 | A1* | 12/2018 | Dote | H10W 90/00 |
| 2019/0319626 | A1* | 10/2019 | Dabral | H03K 19/1776 |
| 2020/0035737 | A1 | 1/2020 | Ito | |
| 2020/0177226 | A1 | 6/2020 | Cha et al. | |
| 2021/0049979 | A1* | 2/2021 | Sakai | G06F 3/1423 |

FOREIGN PATENT DOCUMENTS

| | | | |
|---|---|---|---|
| CN | 110602421 | A | 12/2019 |
| EP | 2302905 | A | 3/2011 |
| EP | 3582491 | A1 | 12/2019 |
| JP | 2010-165854 | | 7/2010 |
| JP | 2013026565 | A | 2/2013 |
| JP | 2013026896 | A | 2/2013 |
| JP | 2016-533140 | | 10/2016 |
| JP | 2018-160667 | | 10/2018 |
| JP | 2018-182038 | | 11/2018 |
| JP | 2021575720 | | 1/2021 |
| JP | 7626723 | B2 | 2/2025 |
| WO | WO 2017/009944 | | 1/2017 |
| WO | WO 2017/013806 | | 1/2017 |
| WO | WO-2017135244 | A1 | 8/2017 |
| WO | WO-2019135304 | A1 | 7/2019 |
| WO | WO-2019171861 | A1 | 9/2019 |

* cited by examiner

SOLID-STATE IMAGING DEVICE AND IMAGING APPARATUS

CROSS REFERENCE TO RELATED APPLICATIONS

This application is a national stage application under 35 U.S.C. 371 and claims the benefit of PCT Application No. PCT/JP2021/002230, having an international filing date of 22 Jan. 2021, which designated the United States, which PCT application claimed the benefit of Japanese Patent Application No. 2020-016454, filed 3 Feb. 2020, the entire disclosures of each of which are incorporated herein by reference.

TECHNICAL FIELD

The present disclosure relates to a solid-state imaging device and an imaging apparatus.

BACKGROUND ART

In recent years, an asynchronous solid-state imaging device has been proposed in which an address event detection circuit is provided at each pixel to detect, for each pixel address, that the amount of light in the pixel has exceeded a threshold value as an address event in real time (see, e.g., Patent Document 1).

CITATION LIST

Patent Document

Patent Document 1: JP 2016-533140 W

SUMMARY OF THE INVENTION

Problems to be Solved by the Invention

However, the above-described conventional technology has difficulties in improving the resolution of such an asynchronous solid-state imaging device.

Thus, the present disclosure proposes a solid-state imaging device and an imaging apparatus that can improve resolution.

Solutions to Problems

According to the present disclosure, a solid-state imaging device is provided. The solid-state imaging device includes a light-receiving substrate, a circuit board, and a plurality of first connections. The light-receiving substrate includes a plurality of light-receiving circuits provided with photoelectric conversion elements. The circuit board is directly bonded to the light-receiving substrate and includes a plurality of address event detection circuits that detects individual changes in voltages output from the photoelectric conversion elements of the plurality of light-receiving circuits. The plurality of first connections is provided at a joint between the light-receiving substrate and the circuit board to electrically connect the light-receiving circuits and the address event detection circuits corresponding to each other.

MODE FOR CARRYING OUT THE INVENTION

Figure 1:
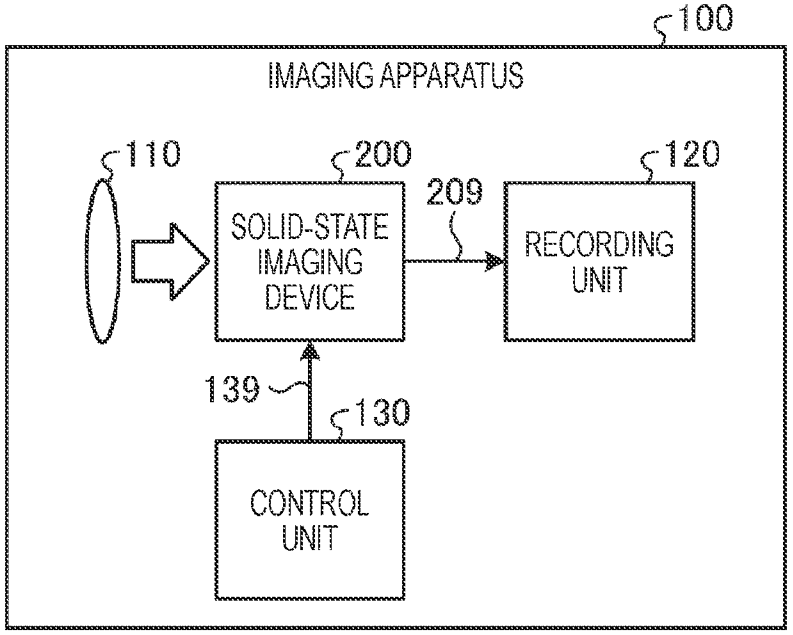
FIG. 1 is a block diagram illustrating a configuration example of an imaging apparatus according to an embodiment of the present disclosure.

Hereinafter, embodiments of the present disclosure will be described in detail with reference to the drawings. Note that in the following embodiments, the same parts are denoted by the same reference numerals to omit redundant descriptions.

A synchronous solid-state imaging device, which captures image data (frames) in synchronization with a synchronization signal such as a vertical synchronization signal, has been used in an imaging apparatus or the like. The typical synchronous solid-state imaging device can acquire image data only at every cycle of the synchronization signal (e.g., 1/60 seconds) and thus has difficulties in responding to requests for higher-speed processing in fields related to transportation, robots, etc.

Then, there has been proposed an asynchronous solid-state imaging device in which an address event detection circuit is provided at each pixel to detect, for each pixel address, that the amount of light in the pixel has exceeded a threshold value as an address event in real time. In this solid-state imaging device, a photodiode and a plurality of transistors for detecting address events are disposed at each pixel.

However, the above-described conventional technology electrically connects the individual pixels and the address event detection circuits via through silicon vias (TSVs) formed around the pixel array, so that the area of the TSV region increases as the number of pixels is increased.

That is, in a case where the number of pixels in the pixel array is increased to improve the resolution of the solid-state imaging device, the area of the TSV region in the device also increases, so that the area in which the pixel array can be disposed decreases. Thus, it is difficult to improve the resolution of the solid-state imaging device.

Thus, it is expected to realize a technology that can overcome the above-described problem and improve the resolution of the solid-state imaging device.

[Configuration of Imaging Apparatus]

First, a configuration of an imaging apparatus 100 according to an embodiment will be described with reference to FIG. 1. FIG. 1 is a block diagram illustrating a configuration example of the imaging apparatus 100 according to the embodiment of the present disclosure.

The imaging apparatus 100 according to the embodiment includes a lens 110, a solid-state imaging device 200, a recording unit 120, and a control unit 130. The imaging apparatus 100 may be a camera mounted on a wearable device, a vehicle-mounted camera, or the like.

The lens 110 captures incident light from a subject, forming an image on an imaging surface of the solid-state imaging device 200.

The solid-state imaging device 200 is also referred to as a dynamic vision sensor (DVS), and detects, for each of a plurality of pixels, that the absolute value of the amount of change in brightness has exceeded threshold values as address events. The address events include, for example, an on event indicating that the amount of increase in brightness has exceeded an upper threshold value, and an off event indicating that the amount of decrease in brightness has fallen below a lower threshold value less than the upper threshold value.

Then, the solid-state imaging device 200 generates detection signals indicating the results of detection of the address events for each pixel. The individual detection signals include an on event detection signal $V_{CH}$ indicating the presence or absence of the on event (see FIG. 6) and an off event detection signal $V_{CL}$ indicating the presence or absence of the off event (see FIG. 6).

The solid-state imaging device 200 performs predetermined signal processing such as image recognition processing on image data including the detection signals at a signal processing unit (not illustrated), and outputs the processed data to the recording unit 120 via a signal line 209.

The recording unit 120 records the data from the solid-state imaging device 200. The control unit 130 controls the solid-state imaging device 200 to cause the solid-state imaging device 200 to capture image data.

[Configuration of Solid-State Imaging Device]

Figure 2:
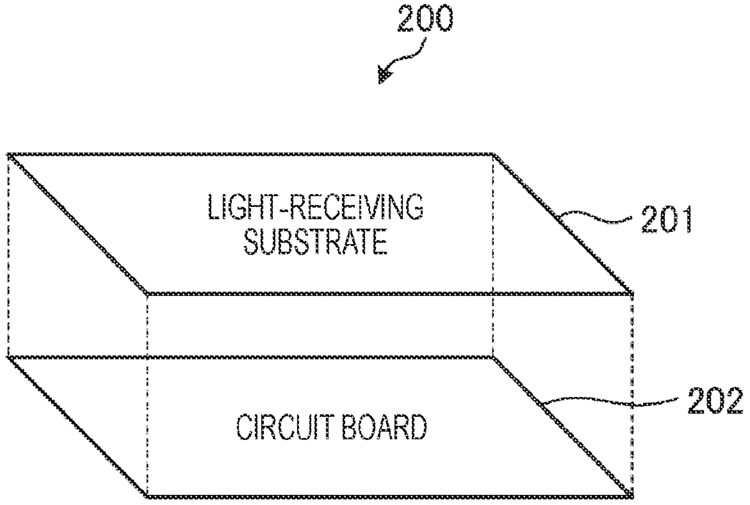
FIG. 2 is a diagram for explaining a laminated structure of a solid-state imaging device according to the embodiment of the present disclosure.

Next, a configuration of the solid-state imaging device 200 according to the embodiment will be described with reference to FIGS. 2 to 20. FIG. 2 is a diagram for explaining a laminated structure of the solid-state imaging device 200 according to the embodiment of the present disclosure.

The solid-state imaging device 200 according to the embodiment includes a circuit board 202 and a light-receiving substrate 201 placed on the circuit board 202 in layers. The light-receiving substrate 201 and the circuit board 202 are electrically connected via connections such as vias, Cu—Cu bonding, or bumps.

Figure 3:
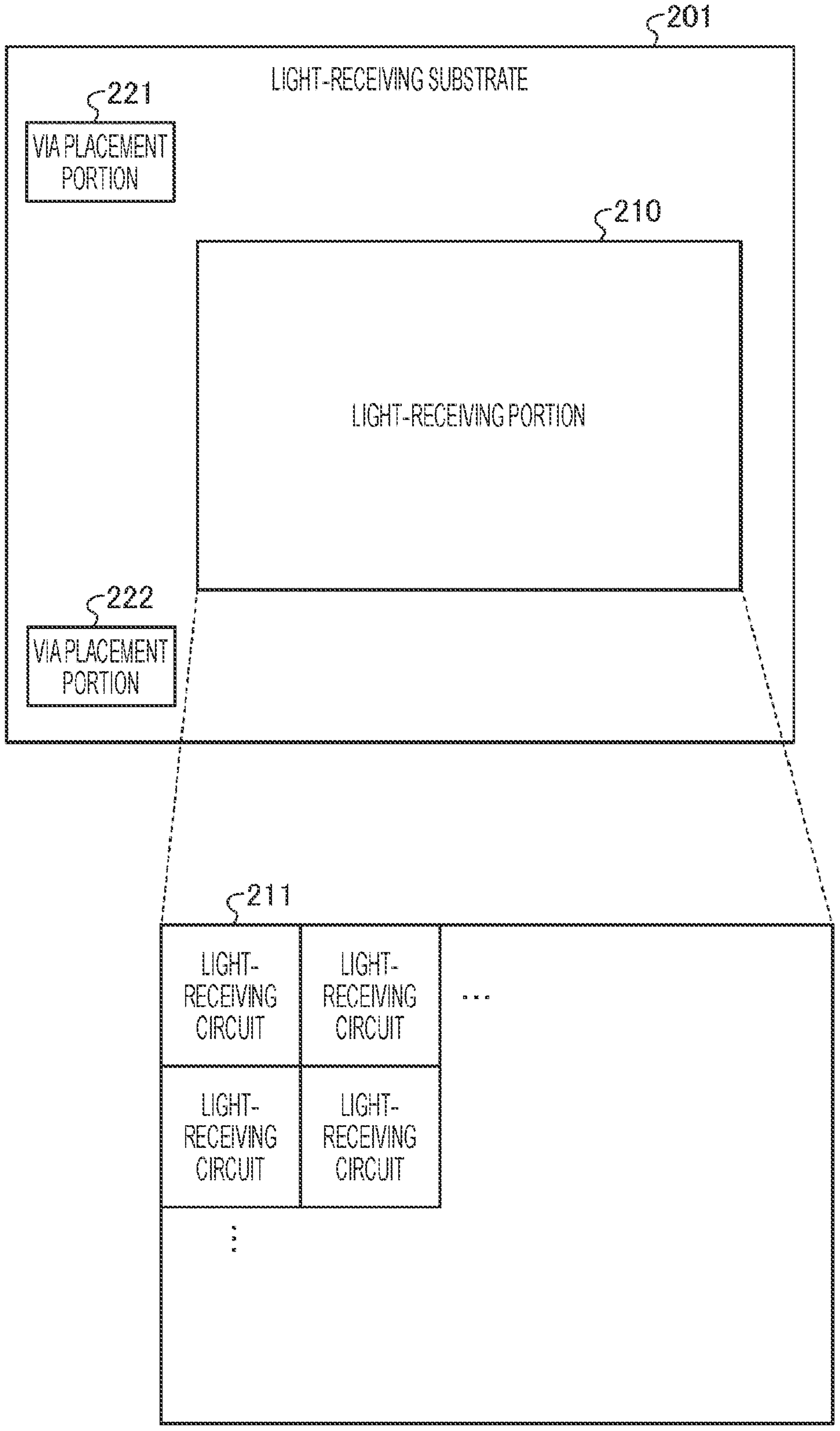
FIG. 3 is a diagram for explaining a planar configuration of a light-receiving substrate according to the embodiment of the present disclosure.

FIG. 3 is a diagram for explaining a planar configuration of the light-receiving substrate 201 according to the embodiment of the present disclosure. As illustrated in FIG. 3, the light-receiving substrate 201 includes a light-receiving portion 210, a via placement portion 221, and a via placement portion 222.

In the light-receiving portion 210, a plurality of light-receiving circuits 211 is arranged in a two-dimensional grid-like pattern. The light-receiving circuits 211 photoelectrically convert incident light to generate photocurrents, and current-voltage convert the photocurrents to output voltage signals. Each of the light-receiving circuits 211 is assigned a pixel address including a row address and a column address.

Vias connected to the circuit board 202 (see FIG. 4) are disposed in the via placement portion 221 and the via placement portion 222.

Figure 4:
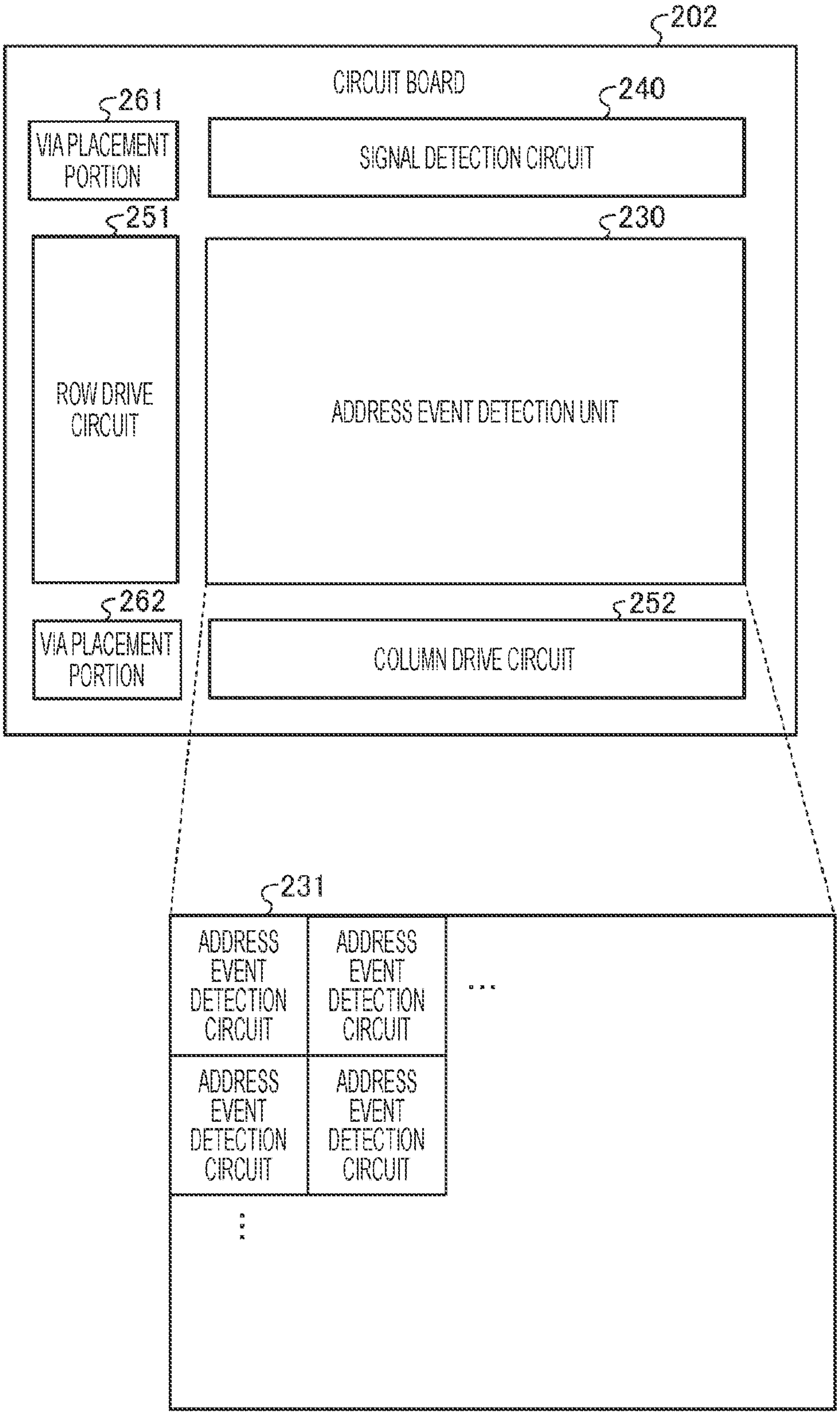
FIG. 4 is a diagram for explaining a planar configuration of a circuit board according to the embodiment of the present disclosure.

FIG. 4 is a diagram for explaining a planar configuration of the circuit board 202 according to the embodiment of the present disclosure. As illustrated in FIG. 4, the circuit board 202 includes an address event detection unit 230, a signal processing circuit 240, a row drive circuit 251, a column drive circuit 252, a via placement portion 261, and a via placement portion 262.

In the address event detection unit 230, a plurality of address event detection circuits 231 is arranged in a two-dimensional grid-like pattern. The address event detection circuits 231 quantize the voltage signals from the light-receiving circuits 211 and output the quantized voltage signals as detection signals.

Each of the address event detection circuits 231 is assigned a pixel address and is electrically connected to the light-receiving circuit 211 of the same address. Furthermore, in the embodiment, the light-receiving circuit 211 and the address event detection circuit 231 of the same address are disposed at the same position in a planar view.

The signal processing circuit 240 performs predetermined signal processing on the detection signals from the address event detection unit 230. For example, the signal processing circuit 240 arranges the detection signals as pixel signals in a two-dimensional grid-like pattern, and acquires image data having two-bit information on each pixel. Then, the signal processing circuit 240 performs signal processing such as image recognition processing on the acquired image data.

The row drive circuit 251 selects a row address and causes the address event detection unit 230 to output detection signals corresponding to the selected row address. The column drive circuit 252 selects a column address and causes the address event detection unit 230 to output detection signals corresponding to the selected column address. Vias connected to the light-receiving substrate 201 (see FIG. 3) are disposed in the via placement portion 261 and the via placement portion 262.

Figure 5:
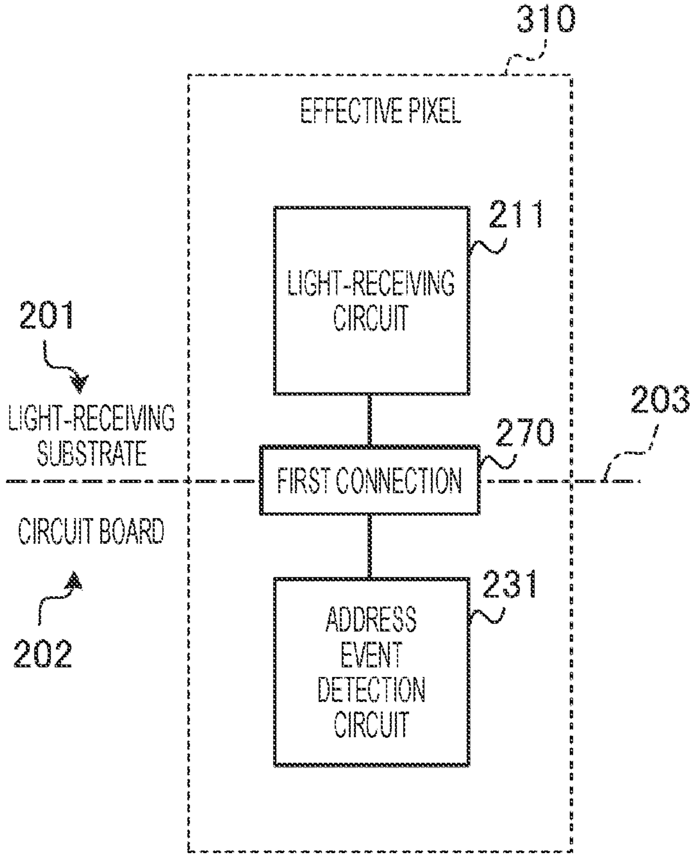
FIG. 5 is a diagram for explaining a configuration of an effective pixel according to the embodiment of the present disclosure.

FIG. 5 is a diagram for explaining a configuration of an effective pixel 310 according to the embodiment of the present disclosure. As illustrated in FIG. 5, each effective pixel 310 includes the light-receiving circuit 211 in the light-receiving substrate 201 and the address event detection circuit 231 in the circuit board 202 to which the same pixel address is assigned.

As described above, in the light-receiving substrate 201 and the circuit board 202, the plurality of light-receiving circuits 211 and the plurality of address event detection circuits 231 are arranged in the two-dimensional grid-like pattern. Furthermore, the light-receiving circuit 211 and the address event detection circuit 231 of the same address are disposed at the same position in a planar view.

That is, in the solid-state imaging device 200 according to the embodiment, the effective pixels 310 each including a pair of the light-receiving circuit 211 and the address event detection circuit 231 are arranged in a two-dimensional grid-like pattern.

Then, each pair of the light-receiving circuit 211 and the address event detection circuit 231 are electrically connected via a first connection 270 provided at a joint 203 between the light-receiving substrate 201 and the circuit board 202.

Figure 6:
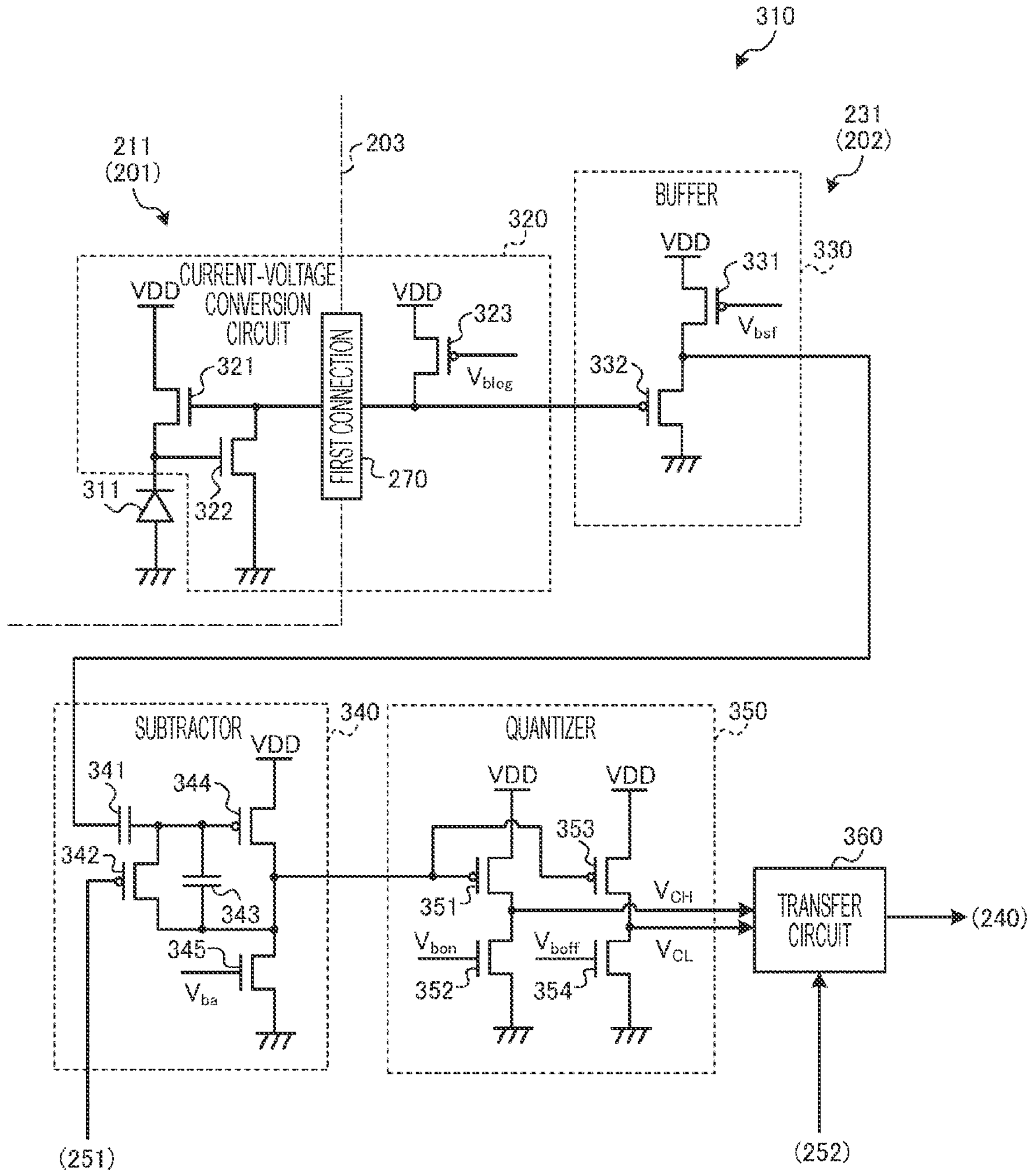
FIG. 6 is a diagram illustrating a circuit configuration of the effective pixel according to the embodiment of the present disclosure.

FIG. 6 is a diagram illustrating a circuit configuration of the effective pixel 310 according to the embodiment of the present disclosure. As illustrated in FIG. 6, the effective pixel 310 includes a photodiode 311, a current-voltage conversion circuit 320, a buffer 330, a subtractor 340, a quantizer 350, and a transfer circuit 360.

In the embodiment of the present disclosure, of the parts of the effective pixel 310, the photodiode 311 and N-type transistors 321 and 322 of the current-voltage conversion circuit 320 are included in the light-receiving circuit 211. Furthermore, of the parts of the effective pixel 310, the buffer 330, the subtractor 340, the quantizer 350, and the transfer circuit 360 are included in the address event detection circuit 231.

That is, in the embodiment of the present disclosure, the effective pixel 310 includes the photodiode 311, the current-voltage conversion circuit 320, and the address event detection circuit 231.

The photodiode 311 photoelectrically converts incident light to generate a photocurrent. Then, the photodiode 311 provides the generated photocurrent to the current-voltage conversion circuit 320.

The current-voltage conversion circuit 320 converts the photocurrent from the photodiode 311 into a logarithmic voltage signal thereof. Then, the current-voltage conversion circuit 320 provides the converted voltage signal to the buffer 330.

The buffer 330 corrects the voltage signal sent from the current-voltage conversion circuit 320 and outputs the corrected signal to the subtractor 340. In the effective pixel 310 according to the embodiment, the buffer 330 can improve driving force to drive the following stage, and also allows the isolation of noise accompanying switching operations in the following stage to be achieved.

The subtractor 340 determines the amount of change in the corrected signal sent from the buffer 330 by subtraction processing. Then, the subtractor 340 provides the determined amount of change to the quantizer 350 as a differential signal.

The quantizer 350 converts (i.e. quantizes) the analog differential signal into digital detection signals by comparing the differential signal with predetermined threshold values. The quantizer 350 according to the embodiment compares the differential signal with each of the upper threshold value and the lower threshold value, and provides the results of the comparisons to the transfer circuit 360 as two-bit detection signals.

The transfer circuit 360 transfers the detection signals to the signal processing circuit 240 according to the column drive signal from the column drive circuit 252.

A specific circuit configuration of each part will be described below. The current-voltage conversion circuit 320 includes the N-type transistor 321, the N-type transistor 322, and a P-type transistor 323. As the N-type transistor 321, the N-type transistor 322, and the P-type transistor 323, for example, metal-oxide-semiconductor (MOS) transistors are used.

The source of the N-type transistor 321 is connected to the cathode of the photodiode 311, and the drain is connected to a terminal of a power supply voltage VDD. The anode of the photodiode 311 is connected to a terminal of a ground potential. The P-type transistor 323 and the N-type transistor 322 are connected in series in this order between a terminal of the power supply voltage VDD and a terminal of the ground potential.

A point of connection between the P-type transistor 323 and the N-type transistor 322 is connected to the gate of the N-type transistor 321 and to an input terminal of the buffer 330. A point of connection between the N-type transistor 321 and the photodiode 311 is connected to the gate of the N-type transistor 322. A predetermined bias voltage $V_{blog}$ is applied to the gate of the P-type transistor 323.

Then, the N-type transistor 321 converts a photocurrent generated by the photodiode 311 into a voltage between the gate and the source. The N-type transistor 322 amplifies the voltage between the gate at a potential corresponding to the photocurrent and the source at the ground potential, and outputs it from the drain.

Furthermore, the P-type transistor 323 supplies a constant current based on the bias voltage $V_{blog}$ to the N-type transistor 322. With this configuration, the current-voltage conversion circuit 320 converts a photocurrent from the photodiode 311 into a voltage signal.

Note that in the solid-state imaging device 200 according to the embodiment, the photodiode 311, the N-type transistor 321, and the N-type transistor 322 are disposed in the light-receiving substrate 201, and the P-type transistor 323 and circuits downstream thereof are disposed in the circuit board 202.

Figure 7:
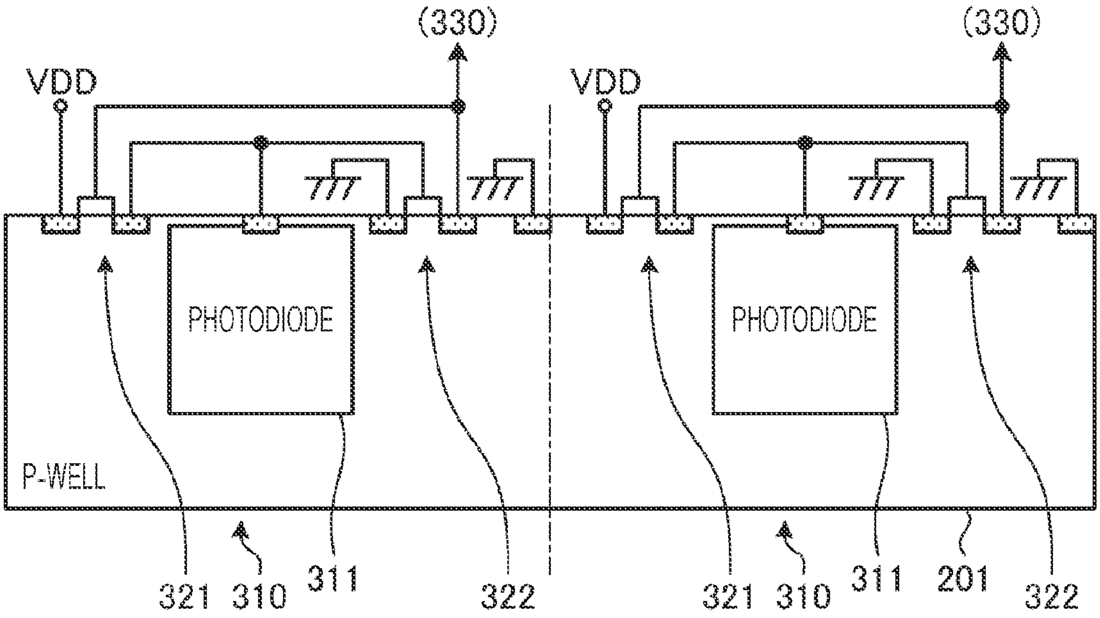
FIG. 7 is a diagram for explaining a configuration of the effective pixel according to the embodiment of the present disclosure.

FIG. 7 is a diagram for explaining a configuration of the effective pixels 310 according to the embodiment of the present disclosure. As illustrated in FIG. 7, in P-well regions of the light-receiving substrate 201, the photodiodes 311 are embedded, and the back gates of the N-type transistors 321 and the back gates of the N-type transistors 322 are formed.

The power supply voltage VDD is supplied to the drains of the N-type transistors 321. The potential of the P-well regions (i.e. the anodes of the photodiodes 311) and the potential of the sources of the N-type transistors 322 are the ground potential. Furthermore, the respective P-well regions of the adjacent effective pixels 310 are separated by a pixel separation portion 410 (see FIG. 8) formed in a dot-dash line portion.

The description returns to FIG. 6. The buffer 330 includes a P-type transistor 331 and a P-type transistor 332. As the P-type transistor 331 and the P-type transistor 332, for example, MOS transistors are used.

The P-type transistor 331 and the P-type transistor 332 are connected in series in this order between a terminal of the power supply voltage VDD and a terminal of the ground potential. A predetermined bias voltage $V_{bsf}$ is applied to the gate of the P-type transistor 331. The gate of the P-type transistor 332 is connected to an output terminal of the current-voltage conversion circuit 320.

With this configuration, the buffer 330 outputs a corrected voltage signal from a point of connection between the P-type transistor 331 and the P-type transistor 332 to the subtractor 340.

The subtractor 340 includes a capacitor 341, a P-type transistor 342, a capacitor 343, a P-type transistor 344, and an N-type transistor 345. As the P-type transistor 342, the P-type transistor 344, and the N-type transistor 345, for example, MOS transistors are used.

The P-type transistor 344 and the N-type transistor 345 are connected in series in this order between a terminal of the power supply voltage VDD and a terminal of a reference potential. A predetermined bias voltage $V_{ba}$ is applied to the gate of the N-type transistor 345.

The P-type transistor 344 and the N-type transistor 345 function as an inverter that inverts and outputs an input signal with the gate of the P-type transistor 344 as an input terminal and a point of connection between the P-type transistor 344 and the N-type transistor 345 as an output terminal.

One end of the capacitor 341 is connected to an output terminal of the buffer 330, and the other end is connected to the input terminal of the inverter (i.e. the gate of the P-type transistor 344). One end of the capacitor 343 is connected to the input terminal of the inverter, and the other end is connected to the output terminal of the inverter (i.e. the point of connection between the P-type transistor 344 and the N-type transistor 345).

The P-type transistor 342 opens and closes a path connecting both ends of the capacitor 343 according to the row drive signal output from the row drive circuit 251.

When the P-type transistor 342 is turned on, a voltage signal $V_{init}$ is input to the buffer 330 side of the capacitor 341, and the opposite side becomes a virtual ground terminal. The potential of the virtual ground terminal is taken as zero for convenience.

At this time, a charge $Q_{init}$ accumulated in the capacitor 341 is expressed by the following formula (1), where C1 is the capacitance of the capacitor 341. On the other hand, both ends of the capacitor 343 are short-circuited, and thus its accumulated charge is zero.

$$Q_{init}=C1\times V_{init} \tag{1}$$

Next, considering a case where the P-type transistor 342 is turned off, and the buffer 330-side voltage of the capacitor 341 changes to $V_{after}$, a charge $Q_{after}$ accumulated in the capacitor 341 is expressed by the following formula (2).

$$Q_{after}=C1\times V_{after} \tag{2}$$

On the other hand, a charge Q2 accumulated in the capacitor 343 is expressed by the following formula (3), where C2 is the capacitance of the capacitor 343, and $V_{out}$ is the output voltage.

$$Q2=-C2\times V_{out} \tag{3}$$

At this time, since the total amount of the charges in the capacitor 341 and the capacitor 343 does not change, the following formula (4) holds.

$$Q_{init}=Q_{after}+Q2 \tag{4}$$

Then, by substituting formulas (1) to (3) into formula (4) for deformation, the following formula (5) is obtained.

$$V_{out}=-(C1/C2)\times(V_{after}-V_{init}) \tag{5}$$

The above formula (5) represents a voltage signal subtraction operation. The gain of the result of the subtraction is C1/C2. It is normally desirable to maximize the gain. Thus, it is preferable to design the capacitance C1 to be large and the capacitance C2 to be small. On the other hand, if the capacitance C2 is too small, kTC noise can increase, deteriorating noise characteristics. Thus, the capacitance reduction of the capacitance C2 is limited to a range in which noise is acceptable.

Furthermore, since the subtractor 340 is mounted at each effective pixel 310, the capacitance C1 and the capacitance C2 have area restrictions. In view of these, for example, the capacitance C1 is set to a value of 20 to 200 femtofarads (fF), and the capacitance C2 is set to a value of 1 to 20 femtofarads (fF).

The quantizer 350 includes a P-type transistor 351, an N-type transistor 352, a P-type transistor 353, and an N-type transistor 354. As the P-type transistor 351, the N-type transistor 352, the P-type transistor 353, and the N-type transistor 354, for example, MOS transistors are used.

The P-type transistor 351 and the N-type transistor 352 are connected in series in this order between a terminal of the power supply voltage VDD and a terminal of the ground potential. The P-type transistor 353 and the N-type transistor 354 are connected in series in this order between a terminal of the power supply voltage VDD and a terminal of the reference potential.

Furthermore, the gate of the P-type transistor 351 and the gate of the P-type transistor 353 are connected to the output terminal of the subtractor 340. A bias voltage $V_{bon}$ indicating the upper threshold value is applied to the gate of the N-type transistor 352. A bias voltage $V_{boff}$ indicating the lower threshold value is applied to the gate of the N-type transistor 354.

A point of connection between the P-type transistor 351 and the N-type transistor 352 is connected to the transfer circuit 360. In the quantizer 350, the voltage at this connection point is output to the transfer circuit 360 as the on event detection signal $V_{CH}$.

A point of connection between the P-type transistor 353 and the N-type transistor 354 is connected to the transfer circuit 360. In the quantizer 350, the voltage at this connection point is output as the off event detection signal $V_{CL}$.

With this configuration, the quantizer 350 outputs the on event detection signal $V_{CH}$ at a high level when the differential signal has exceeded the upper threshold value, and outputs the off event detection signal $V_{CL}$ at a low level when the differential signal has fallen below the lower threshold value. That is, the solid-state imaging device 200 according to the embodiment can simultaneously detect the presence or absence of both the on event and the off event.

Figure 8:
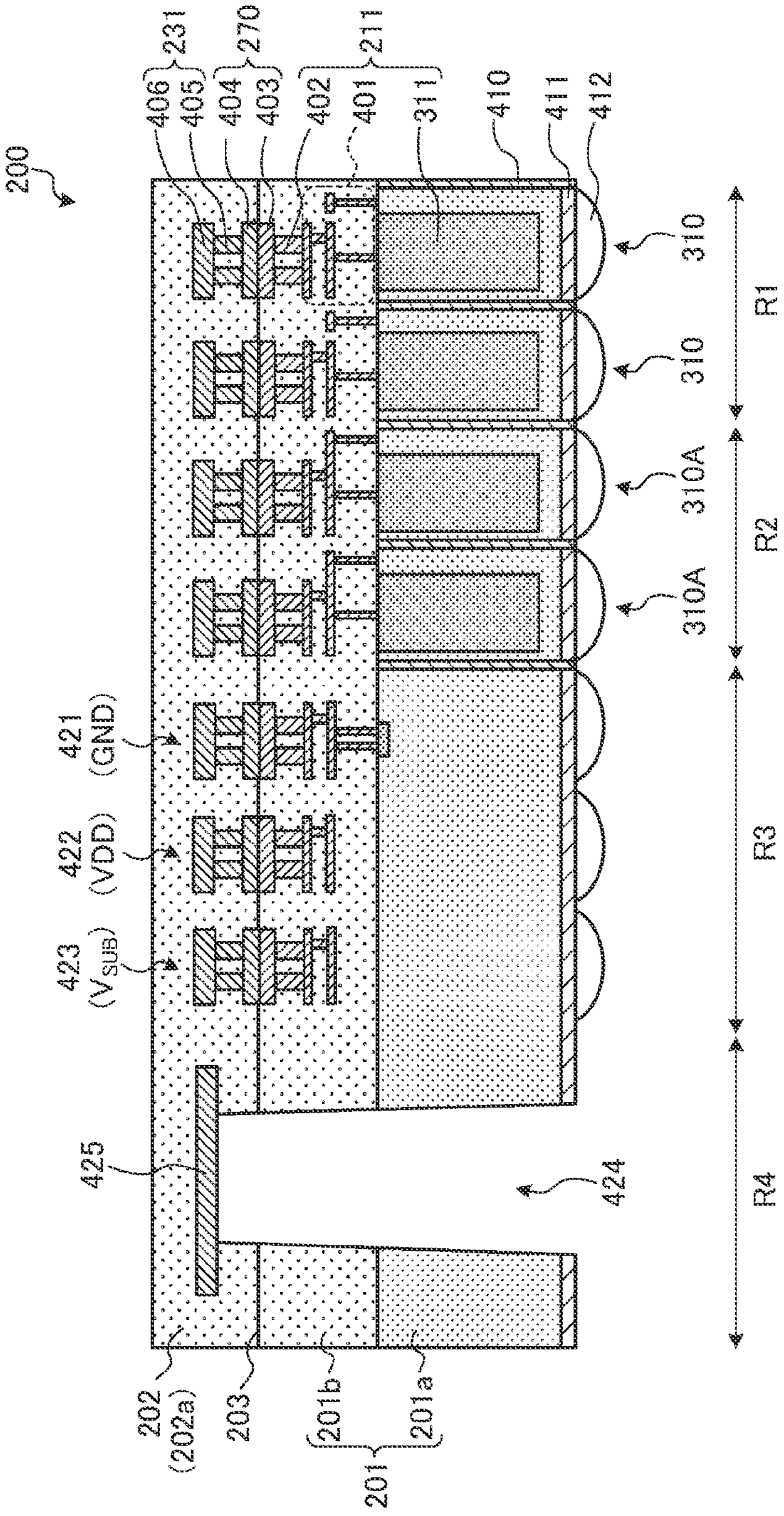
FIG. 8 is a diagram illustrating a cross-sectional configuration of the solid-state imaging device according to the embodiment of the present disclosure.

FIG. 8 is a diagram illustrating a cross-sectional configuration of the solid-state imaging device 200 according to the embodiment of the present disclosure, and mainly illustrates a cross-sectional structure of a peripheral portion of the solid-state imaging device 200. As illustrated in FIG. 8, the solid-state imaging device 200 includes an effective pixel region R1, a dummy pixel region R2, a power supply region R3, and a pad region R4.

The effective pixel region R1 is a region in which the light-receiving portion 210 and the address event detection unit 230 stacked in layers are provided. In the effective pixel region R1, the plurality of effective pixels 310 is arranged in the two-dimensional grid-like pattern.

Figure 9:
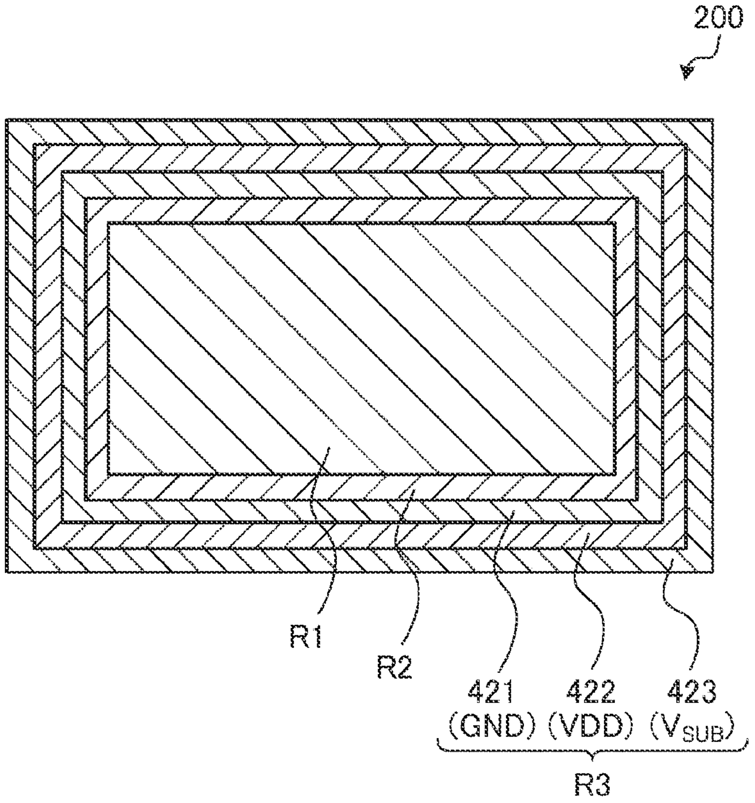
FIG. 9 is a diagram illustrating a planar configuration of the solid-state imaging device according to the embodiment of the present disclosure.

As illustrated in FIG. 9, the dummy pixel region R2 is a region provided around the effective pixel region R1. FIG. 9 is a diagram illustrating a planar configuration of the solid-state imaging device 200 according to the embodiment of the present disclosure.

Furthermore, as illustrated in FIG. 8, a plurality of dummy pixels 310A is arranged side by side in the dummy pixel region R2. The dummy pixels 310A have the same basic configuration as the effective pixels 310, but are pixels that do not output signals to the outside.

The solid-state imaging device 200 according to the embodiment, in which the dummy pixel region R2 is formed around the effective pixel region R1, can thus provide the regularity of process from the center to the edge of the effective pixel region R1. Consequently, the embodiment can improve the manufacturing yield of the solid-state imaging device 200.

As illustrated in FIG. 9, the power supply region R3 is a region provided around the dummy pixel region R2. The power supply region R3 includes ground wiring 421 to which the ground potential is externally applied, power supply wiring 422 to which the power supply voltage VDD is externally applied, and power supply wiring 423 to which a substrate voltage $V_{SUB}$ is externally applied. The ground wiring 421 and the power supply wiring 422 and 423 are formed, for example, in a ring shape around the dummy pixel region R2.

The ground wiring 421 supplies the ground potential to the plurality of effective pixels 310 and others. The power supply wiring 422 supplies the power supply voltage VDD to the plurality of effective pixels 310 and others. The power supply wiring 423 supplies the substrate voltage $V_{SUB}$ having the same potential as the power supply voltage VDD to a region other than the effective pixel region R1 and the dummy pixel region R2 of the solid-state imaging device 200.

The solid-state imaging device 200 according to the embodiment, in which the power supply wiring 423 is provided separately from the power supply wiring 422, can thus supply the stable substrate voltage $V_{SUB}$ to the peripheral portion of the solid-state imaging device 200 even in a case where the power supply voltage VDD varies when the effective pixels 310 operate, for example. Consequently, the embodiment allows the solid-state imaging device 200 to be operated stably.

The description returns to FIG. 8. The pad region R4 is a region provided around the power supply region R3, and includes a contact hole 424 and a bonding pad 425. The contact hole 424 is formed from the light incidence side surface of the light-receiving substrate 201 to the middle of the circuit board 202 along the thickness direction of the light-receiving substrate 201 and the circuit board 202.

The bonding pad 425 is provided at the bottom of the contact hole 424. In the embodiment, a bonding wire or the like is bonded to the bonding pad 425 through the contact hole 424 to electrically connect the recording unit 120 (see FIG. 1) or the control unit 130 (see FIG. 1) to each part of the solid-state imaging device 200.

A configuration of the effective pixels 310 arranged in the effective pixel region R1 will be further described with reference to FIG. 8. The solid-state imaging device 200 includes the light-receiving substrate 201 and the circuit board 202 stacked in layers, and the joint 203 is provided at an interface between the light-receiving substrate 201 and the circuit board 202.

The light-receiving substrate 201 includes a semiconductor layer 201*a* and an insulating layer 201*b*. The semiconductor layer 201*a* includes a semiconductor material such as silicon. In the semiconductor layer 201*a*, the photodiode 311, the N-type transistor 321 (see FIG. 7), the N-type transistor 322 (see FIG. 7), etc. are formed at each of the effective pixels 310 and the dummy pixels 310A.

Furthermore, in the semiconductor layer 201*a*, the pixel separation portions 410 are formed so as to separate the effective pixels 310 and the dummy pixels 310A adjacent to each other. The pixel separation portions 410 electrically and optically separate the effective pixels 310 and the dummy pixels 310A adjacent to each other.

The pixel separation portions 410 are formed, for example, to individually enclose the effective pixels 310 and the dummy pixels 310A and to pass through the semiconductor layer 201*a*.

A planarizing film 411 is formed on the light incidence side surface of the semiconductor layer 201*a*. On-chip lenses 412 are formed on the light incidence side surface of the planarizing film 411. The planarizing film 411 planarizes a surface on which the on-chip lenses 412 are mounted.

The on-chip lenses 412 are, for example, individually provided at the effective pixels 310 and the dummy pixels 310A to concentrate incident light onto the effective pixels 310 and the dummy pixels 310A.

The insulating layer 201*b* includes an insulating material such as silicon oxide ($SiO_x$), silicon nitride (SiN), or silicon oxynitride (SiON), and is provided on the surface of the semiconductor layer 201*a* opposite to the light incidence side.

Furthermore, wiring portions 401 including wiring layers, vias, etc. are formed in the insulating layer 201*b*. Each wiring portion 401 is electrically connected to the photodiode 311, the N-type transistor 321, and the N-type transistor 322 provided in the semiconductor layer 201*a* in the wiring configuration illustrated in FIG. 6.

The wiring portions 401 are electrically connected to first pads 403 through vias 402. The first pads 403 are provided to be exposed at the surface of the light-receiving substrate 201 opposite to the light incidence side surface (i.e. the interface with the circuit board 202), and include copper or a copper alloy.

The circuit board 202 has an insulating layer 202*a* on the side of the interface with the light-receiving substrate 201. The insulating layer 202*a* includes an insulating material such as silicon oxide, silicon nitride, or silicon oxynitride.

Furthermore, the insulating layer 202*a* includes second pads 404. The second pads 404 are provided to be exposed at the light incidence side surface of the circuit board 202 (i.e. the interface with the light-receiving substrate 201), and include copper or a copper alloy.

The second pads 404 are electrically connected to wiring portions 406 through vias 405. Each wiring portion 406 is electrically connected to the gate of the P-type transistor 332 (see FIG. 6) and the source of the P-type transistor 323 (see FIG. 6).

Here, in the embodiment, as illustrated in FIG. 8, the first pads 403 and the second pads 404 are directly bonded together by Cu—Cu bonding. That is, each effective pixel 310 according to the embodiment includes the first connection 270 including the first pad 403 and the second pad 404. Thus, in the embodiment, every effective pixel 310 is provided with one first connection 270.

As illustrated also in FIG. 5, each first connection 270 is provided at the joint 203 between the light-receiving substrate 201 and the circuit board 202, and electrically connects the light-receiving circuit 211 and the address event detection circuit 231 belonging to the same effective pixel 310.

As described above, in the embodiment, all of the light-receiving circuits 211 and the address event detection circuits 231 are electrically connected by the first connections 270 formed by Cu—Cu bonding.

This can reduce the number of wires that need to be connected at the via placement portions 221, 222, 261, and 262 (see FIGS. 3 and 4), and thus can reduce the area of the via placement portions 221, 222, 261, and 262.

Consequently, the embodiment allows additional effective pixels 310 to be disposed in regions produced by reducing the size of the via placement portions 221, 222, 261, and 262, and thus can improve the resolution of the solid-state imaging device 200.

Furthermore, the embodiment, in which the light-receiving circuits 211 and the address event detection circuits 231 are electrically connected by the first connections 270 formed by Cu—Cu bonding, can thus reduce the electrical resistance between the light-receiving circuits 211 and the address event detection circuits 231.

Consequently, signals related to changes in brightness of light incident on the photodiodes 311 of the light-receiving circuits 211 can be transferred to the address event detection circuits 231 at high speed. Thus, the embodiment allows the asynchronous solid-state imaging device 200 to perform higher-speed processing.

Furthermore, in the embodiment, as illustrated in FIG. 8 and others, each first connection 270 is preferably located between the light-receiving circuit 211 and the address event detection circuit 231 corresponding to each other. Consequently, the light-receiving circuit 211 and the address event detection circuit 231 can be electrically connected at a short distance via the first connection 270.

That is, the embodiment, in which the first connections 270 are disposed between the light-receiving circuits 211 and the address event detection circuits 231 corresponding to each other, can thus reduce the electrical resistance between the light-receiving circuits 211 and the address event detection circuits 231.

Consequently, according to the embodiment, signals detected by the photodiodes 311 of the light-receiving circuits 211 can be transferred to the address event detection circuits 231 at high speed, so that the asynchronous solid-state imaging device 200 can perform higher-speed processing.

Furthermore, in the embodiment, the first pads 403 and the second pads 404 constituting the first connections 270 preferably include the same material (e.g., Cu or a Cu alloy). This allows the first connections 270 to be formed by direct bonding such as Cu—Cu bonding, and thus allows the plurality of first connections 270 in the solid-state imaging device 200 to be formed in one process step.

Thus, the embodiment allows the shortening of the manufacturing process of the solid-state imaging device 200.

Figure 10:
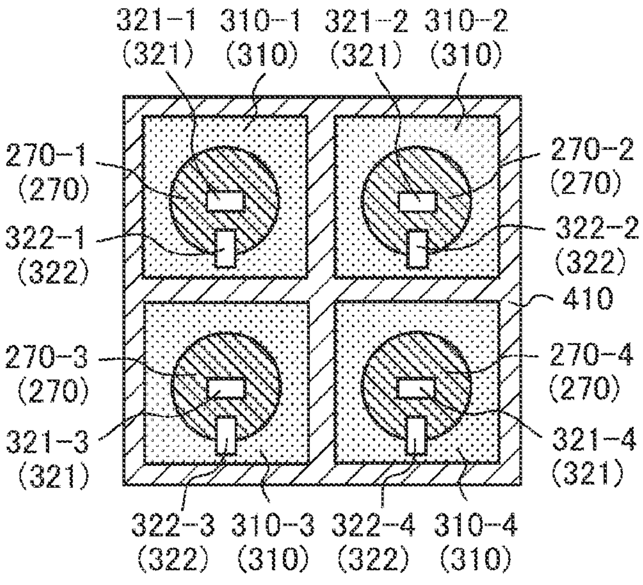
FIG. 10 is a plan view illustrating an arrangement example of first connections in effective pixels according to the embodiment of the present disclosure.

FIG. 10 is a plan view illustrating an arrangement example of the first connections 270 in the effective pixels 310 according to the embodiment of the present disclosure. Note that to facilitate understanding, the first connections 270 are illustrated in a circular shape in FIGS. 10 to 12.

As illustrated in FIG. 10, the pixel separation portions 410 are formed to separate the adjacent effective pixels 310 from each other. Then, in the example of FIG. 10, a first connection 270-1 belonging to an effective pixel 310-1 is placed on the effective pixel 310-1 without overlapping the pixel separation portions 410 in contact with the effective pixel 310-1 in a planar view.

Furthermore, an N-type transistor 321-1 belonging to the effective pixel 310-1 is provided at a position where the effective pixel 310-1 and the first connection 270-1 lie on each other in a planar view. Moreover, an N-type transistor 322-1 belonging to the effective pixel 310-1 is provided from a position where the effective pixel 310-1 and the first connection 270-1 lie on each other to a position where only the effective pixel 310-1 is placed in a planar view.

Likewise, in the example of FIG. 10, a first connection 270-2 belonging to an effective pixel 310-2 is placed on the effective pixel 310-2 without overlapping the pixel separation portions 410 in contact with the effective pixel 310-2 in a planar view.

Furthermore, an N-type transistor 321-2 belonging to the effective pixel 310-2 is provided at a position where the effective pixel 310-2 and the first connection 270-2 lie on each other in a planar view. Moreover, an N-type transistor 322-2 belonging to the effective pixel 310-2 is provided from a position where the effective pixel 310-2 and the first connection 270-2 lie on each other to a position where only the effective pixel 310-2 is placed in a planar view.

Furthermore, a first connection 270-3 belonging to an effective pixel 310-3 is placed on the effective pixel 310-3 without overlapping the pixel separation portions 410 in contact with the effective pixel 310-3 in a planar view.

Furthermore, an N-type transistor 321-3 belonging to the effective pixel 310-3 is provided at a position where the effective pixel 310-3 and the first connection 270-3 lie on each other in a planar view. Moreover, an N-type transistor 322-3 belonging to the effective pixel 310-3 is provided from a position where the effective pixel 310-3 and the first connection 270-3 lie on each other to a position where only the effective pixel 310-3 is placed in a planar view.

Furthermore, a first connection 270-4 belonging to an effective pixel 310-4 is placed on the effective pixel 310-4 without overlapping the pixel separation portions 410 in contact with the effective pixel 310-4 in a planar view.

Furthermore, an N-type transistor 321-4 belonging to the effective pixel 310-4 is provided at a position where the effective pixel 310-4 and the first connection 270-4 lie on each other in a planar view. Moreover, an N-type transistor 322-4 belonging to the effective pixel 310-4 is provided from a position where the effective pixel 310-4 and the first connection 270-4 lie on each other to a position where only the effective pixel 310-4 is placed in a planar view.

Figure 11:
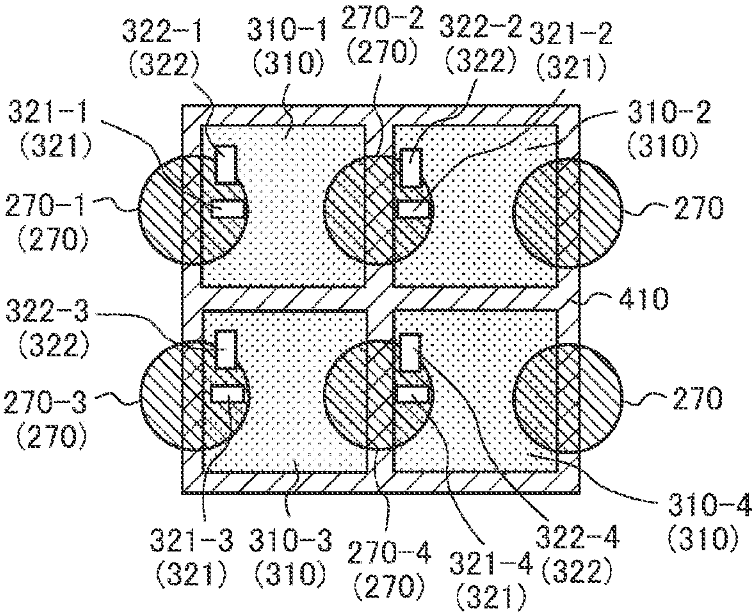
FIG. 11 is a plan view illustrating another arrangement example of the first connections in the effective pixels according to the embodiment of the present disclosure.

Note that the arrangement of the first connections 270 in the effective pixels 310 is not limited to the example of FIG. 10. FIG. 11 is a plan view illustrating another arrangement example of the first connections 270 in the effective pixels 310 according to the embodiment of the present disclosure.

In the example of FIG. 11, the first connection 270-1 belonging to the effective pixel 310-1 is placed to overlap one side (the left side in the figure) of the effective pixel 310-1 and also overlap the pixel separation portion 410 in contact with this side of the effective pixel 310-1 in a planar view.

Furthermore, the N-type transistor 321-1 belonging to the effective pixel 310-1 is provided at a position where the effective pixel 310-1 and the first connection 270-1 lie on each other in a planar view. Moreover, the N-type transistor 322-1 belonging to the effective pixel 310-1 is provided from a position where the effective pixel 310-1 and the first connection 270-1 lie on each other to a position where only the effective pixel 310-1 is placed in a planar view.

Likewise, in the example of FIG. 11, the first connection 270-2 belonging to the effective pixel 310-2 is placed to overlap one side (the left side in the figure) of the effective pixel 310-2 and also overlap the pixel separation portion 410 in contact with this side of the effective pixel 310-2 in a planar view.

Furthermore, the N-type transistor 321-2 belonging to the effective pixel 310-2 is provided at a position where the effective pixel 310-2 and the first connection 270-2 lie on each other in a planar view. Moreover, the N-type transistor 322-2 belonging to the effective pixel 310-2 is provided from a position where the effective pixel 310-2 and the first connection 270-2 lie on each other to a position where only the effective pixel 310-2 is placed in a planar view.

Furthermore, in the example of FIG. 11, the first connection 270-3 belonging to the effective pixel 310-3 is placed to overlap one side (the left side in the figure) of the effective pixel 310-3 and also overlap the pixel separation portion 410 in contact with this side of the effective pixel 310-3 in a planar view.

Furthermore, the N-type transistor 321-3 belonging to the effective pixel 310-3 is provided at a position where the effective pixel 310-3 and the first connection 270-3 lie on each other in a planar view. Moreover, the N-type transistor 322-3 belonging to the effective pixel 310-3 is provided from a position where the effective pixel 310-3 and the first connection 270-3 lie on each other to a position where only the effective pixel 310-3 is placed in a planar view.

Furthermore, in the example of FIG. 11, the first connection 270-4 belonging to the effective pixel 310-4 is placed to overlap one side (the left side in the figure) of the effective pixel 310-4 and also overlap the pixel separation portion 410 in contact with this side of the effective pixel 310-4 in a planar view.

Furthermore, the N-type transistor 321-4 belonging to the effective pixel 310-4 is provided at a position where the effective pixel 310-4 and the first connection 270-4 lie on each other in a planar view. Moreover, the N-type transistor 322-4 belonging to the effective pixel 310-4 is provided from a position where the effective pixel 310-4 and the first connection 270-4 lie on each other to a position where only the effective pixel 310-4 is placed in a planar view.

Figure 12:
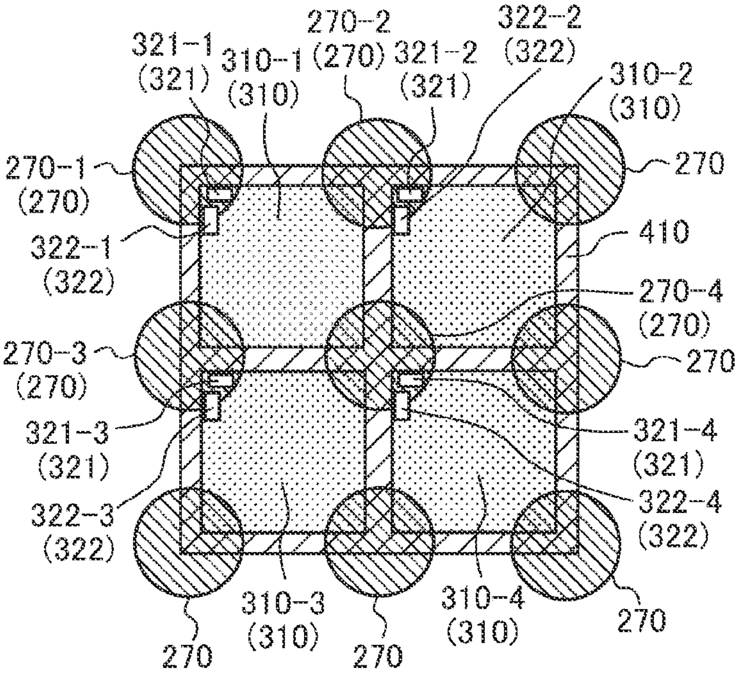
FIG. 12 is a plan view illustrating another arrangement example of the first connections in the effective pixels according to the embodiment of the present disclosure.

FIG. 12 is a plan view illustrating another arrangement example of the first connections 270 in the effective pixels 310 according to the embodiment of the present disclosure. In the example of FIG. 12, the first connection 270-1 belonging to the effective pixel 310-1 is placed to overlap a corner portion (an upper left corner portion in the figure) of the effective pixel 310-1 and also overlap the pixel separation portions 410 in contact with this corner portion of the effective pixel 310-1 in a planar view.

Furthermore, the N-type transistor 321-1 belonging to the effective pixel 310-1 is provided at a position where the effective pixel 310-1 and the first connection 270-1 lie on each other in a planar view. Moreover, the N-type transistor 322-1 belonging to the effective pixel 310-1 is provided from a position where the effective pixel 310-1 and the first connection 270-1 lie on each other to a position where only the effective pixel 310-1 is placed in a planar view.

Likewise, in the example of FIG. 12, the first connection 270-2 belonging to the effective pixel 310-2 is placed to overlap a corner portion (an upper left corner portion in the figure) of the effective pixel 310-2 and also overlap the pixel separation portions 410 in contact with this corner portion of the effective pixel 310-2 in a planar view.

Furthermore, the N-type transistor 321-2 belonging to the effective pixel 310-2 is provided at a position where the effective pixel 310-2 and the first connection 270-2 lie on each other in a planar view. Moreover, the N-type transistor 322-2 belonging to the effective pixel 310-2 is provided from a position where the effective pixel 310-2 and the first connection 270-2 lie on each other to a position where only the effective pixel 310-2 is placed in a planar view.

Furthermore, the first connection 270-3 belonging to the effective pixel 310-3 is placed to overlap a corner portion (an upper left corner portion in the figure) of the effective pixel 310-3 and also overlap the pixel separation portions 410 in contact with this corner portion of the effective pixel 310-3 in a planar view.

Furthermore, the N-type transistor 321-3 belonging to the effective pixel 310-3 is provided at a position where the effective pixel 310-3 and the first connection 270-3 lie on each other in a planar view. Moreover, the N-type transistor 322-3 belonging to the effective pixel 310-3 is provided from a position where the effective pixel 310-3 and the first connection 270-3 lie on each other to a position where only the effective pixel 310-3 is placed in a planar view.

Furthermore, the first connection 270-4 belonging to the effective pixel 310-4 is placed to overlap a corner portion (an upper left corner portion in the figure) of the effective pixel 310-4 and also overlap the pixel separation portions 410 in contact with this corner portion of the effective pixel 310-4 in a planar view.

Furthermore, the N-type transistor 321-4 belonging to the effective pixel 310-4 is provided at a position where the effective pixel 310-4 and the first connection 270-4 lie on each other in a planar view. Moreover, the N-type transistor 322-4 belonging to the effective pixel 310-4 is provided from a position where the effective pixel 310-4 and the first connection 270-4 lie on each other to a position where only the effective pixel 310-4 is placed in a planar view.

Figure 13:
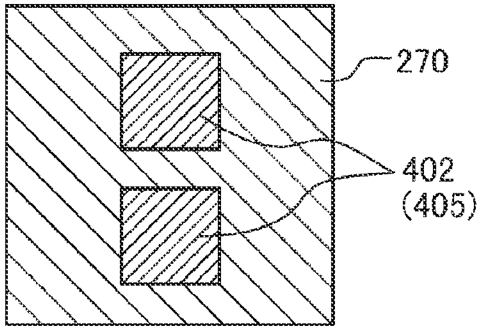
FIG. 13 is a plan view illustrating an arrangement example of vias with respect to a first connection according to the embodiment of the present disclosure.

FIG. 13 is a plan view illustrating an arrangement example of the vias 402 and 405 with respect to the first connection 270 according to the embodiment of the present disclosure. As illustrated in FIG. 13, the first connection 270 according to the embodiment has a rectangular shape in a planar view. Then, in the example of FIG. 13, two vias 402 and two vias 405 are connected to the rectangular first connection 270.

Connecting the two vias 402 and the two vias 405 to the single first connection 270 in this manner can reduce the electrical resistance between the light-receiving circuit 211 and the address event detection circuit 231.

Consequently, according to the embodiment, signals detected by the photodiodes 311 of the light-receiving circuits 211 can be transferred to the address event detection circuits 231 at high speed, so that the asynchronous solid-state imaging device 200 can perform higher-speed processing.

Note that in the example of FIG. 13, an example in which the vias 402 and the vias 405 are placed to coincide with each other in a planar view has been described, but the vias 402 and the vias 405 may not be placed to coincide with each other in a planar view.

Figure 14:
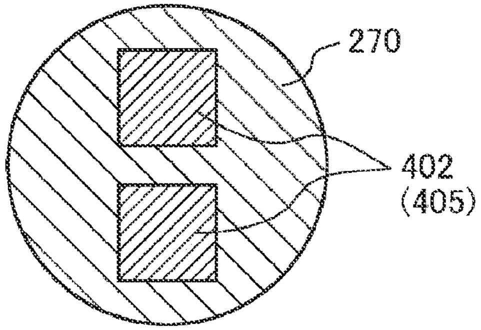
FIG. 14 is a plan view illustrating an arrangement example of the vias with respect to another first connection according to the embodiment of the present disclosure.

Furthermore, the planar shape of the first connections 270 according to the embodiment is not limited to the rectangular shape. FIG. 14 is a plan view illustrating an arrangement example of the vias 402 and 405 with respect to another first connection 270 according to the embodiment of the present disclosure.

In the example of FIG. 14, the first connection 270 has a circular shape in a planar view. Then, the two vias 402 and the two vias 405 are connected to the circular first connection 270. Note that in the example of FIG. 14, the planar shape of the first connection 270 may be elliptical.

Figure 15:
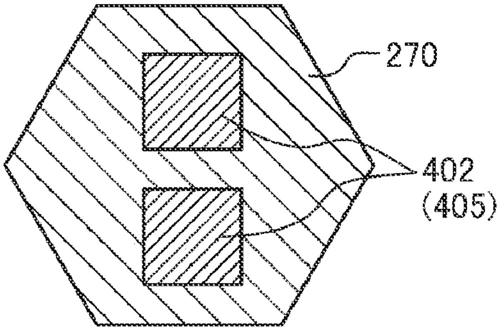
FIG. 15 is a plan view illustrating an arrangement example of the vias with respect to another first connection according to the embodiment of the present disclosure.

FIG. 15 is a plan view illustrating an arrangement example of the vias 402 and 405 with respect to another first connection 270 according to the embodiment of the present disclosure. In the example of FIG. 15, the first connection 270 has a hexagonal shape in a planar view. Then, the two vias 402 and the two vias 405 are connected to the hexagonal first connection 270.

In the example of FIG. 15, by forming the first connection 270 in the hexagonal shape, the first connection 270 can be disposed at the joint 203 in a close-packed state.

Figure 16:
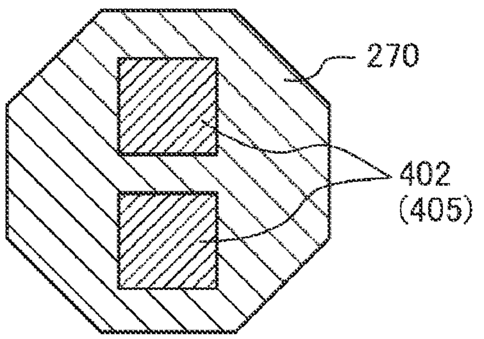
FIG. 16 is a plan view illustrating an arrangement example of the vias with respect to another first connection according to the embodiment of the present disclosure.

FIG. 16 is a plan view illustrating an arrangement example of the vias 402 and 405 with respect to another first connection 270 according to the embodiment of the present disclosure. In the example of FIG. 16, the first connection 270 has an octagonal shape in a planar view. Then, the two vias 402 and the two vias 405 are connected to the octagonal first connection 270.

Figure 17:
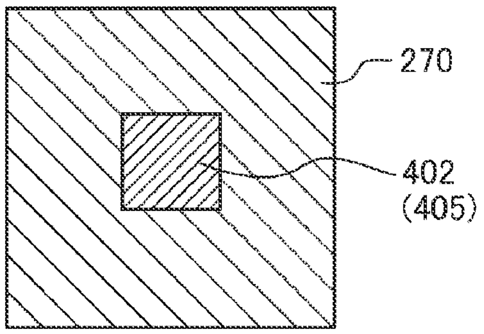
FIG. 17 is a plan view illustrating another arrangement example of vias with respect to the first connection according to the embodiment of the present disclosure.

Furthermore, the numbers of the vias 402 and the vias 405 connected to the first connection 270 according to the embodiment are not limited to two. FIG. 17 is a plan view illustrating another arrangement example of vias 402 and 405 with respect to the first connection 270 according to the embodiment of the present disclosure.

In the example of FIG. 17, the first connection 270 has a rectangular shape in a planar view. Then, one via 402 and one via 405 are connected to the rectangular first connection 270. Note that in the example of FIG. 17, the planar shape of the first connection 270 may be a circular shape, an elliptical shape, a hexagonal shape, an octagonal shape, or the like.

Figure 18:
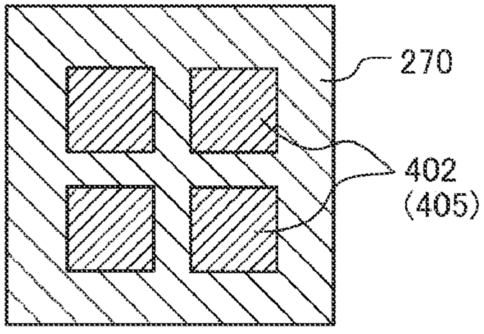
FIG. 18 is a plan view illustrating another arrangement example of vias with respect to the first connection according to the embodiment of the present disclosure.

FIG. 18 is a plan view illustrating another arrangement example of vias 402 and 405 with respect to the first connection 270 according to the embodiment of the present disclosure. In the example of FIG. 18, the first connection 270 has a rectangular shape in a planar view.

Then, four vias 402 and four vias 405 are connected to the rectangular first connection 270. Note that in the example of FIG. 18, the planar shape of the first connection 270 may be a circular shape, an elliptical shape, a hexagonal shape, an octagonal shape, or the like.

Figure 19:
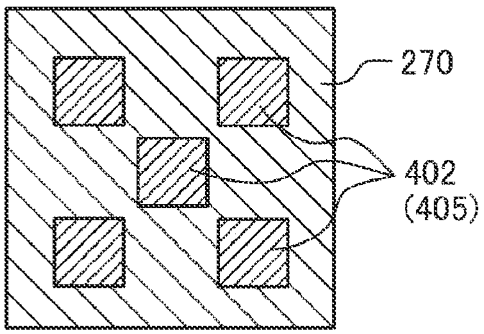
FIG. 19 is a plan view illustrating another arrangement example of vias with respect to the first connection according to the embodiment of the present disclosure.

FIG. 19 is a plan view illustrating another arrangement example of vias 402 and 405 with respect to the first connection 270 according to the embodiment of the present disclosure. In the example of FIG. 19, the first connection 270 has a rectangular shape in a planar view.

Then, five vias 402 and five vias 405 are connected to the rectangular first connection 270. Note that in the example of FIG. 19, the planar shape of the first connection 270 may be a circular shape, an elliptical shape, a hexagonal shape, an octagonal shape, or the like.

Note that in the examples of FIGS. 13 to 19, examples in which the same number of vias 402 and vias 405 are connected to one first connection 270 have been described, but different numbers of vias 402 and vias 405 may be connected to one first connection 270.

Furthermore, in the examples of FIGS. 13 to 19, examples in which the planar shape of the vias 402 and 405 is rectangular have been described, but the planar shape of the vias 402 and 405 is not limited to the rectangular shape.

Figure 20:
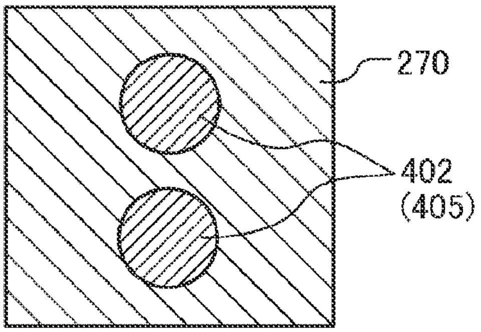
FIG. 20 is a plan view illustrating another arrangement example of vias with respect to the first connection according to the embodiment of the present disclosure.

FIG. 20 is a plan view illustrating another arrangement example of vias 402 and 405 with respect to the first connection 270 according to the embodiment of the present disclosure. As illustrated in FIG. 20, a via 402 and a via 405 having a circular planar shape may be connected to one first connection 270.

Various Modifications

Figure 21:
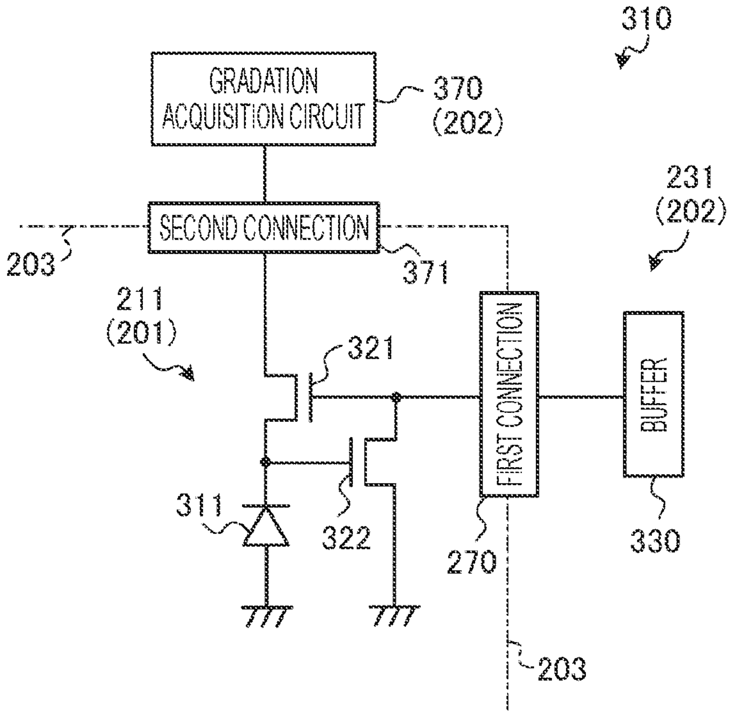
FIG. 21 is a diagram illustrating a circuit configuration of the effective pixel according to a first modification of the embodiment of the present disclosure.

Next, various modifications of the embodiment will be described with reference to FIGS. 21 to 26. FIG. 21 is a diagram illustrating a circuit configuration of the effective pixels 310 according to a first modification of the embodiment of the present disclosure. Note that in the following various modifications, parts downstream of the buffer 330 in the address event detection circuit 231 are not illustrated.

As illustrated in FIG. 21, the first modification is different from the embodiment in that a gradation acquisition circuit 370 is provided in each effective pixel 310. The gradation acquisition circuit 370 is connected to the drain of the N-type transistor 321 in the current-voltage conversion circuit 320 via a second connection 371.

Thus, the solid-state imaging device 200 according to the first modification can acquire the absolute value of brightness in the effective pixel 310 (i.e. a gradation in the effective pixel 310) by detecting the amount of current flowing through the N-type transistor 321 using the gradation acquisition circuit 370.

That is, the solid-state imaging device 200 according to the first modification can detect, for each of the plurality of pixels, that the absolute value of the amount of change in brightness has exceeded a threshold value as an address event, and also can acquire a gradation in each of the plurality of pixels.

Here, in the first modification, the light-receiving circuit 211 and the gradation acquisition circuit 370 belonging to the same effective pixel 310 are electrically connected by the second connection 371 provided at the joint 203 between the light-receiving substrate 201 and the circuit board 202. The second connection 371 includes a first pad and a second pad (not illustrated).

The first pad is provided to be exposed at the surface of the light-receiving substrate 201 opposite to the light incidence side surface (i.e. the interface with the circuit board 202), and includes copper or a copper alloy. Furthermore, the second pad is provided to be exposed at the light incidence side surface of the circuit board 202 (i.e. the interface with the light-receiving substrate 201), and includes copper or a copper alloy.

In the first modification, the first pad and the second pad are directly bonded together by Cu—Cu bonding to form the second connection 371. Then, in the first modification, every effective pixel 310 is provided with one second connection 371.

Thus, in the first modification, all of the light-receiving circuits 211 and the gradation acquisition circuits 370 are electrically connected by the second connections 371 formed by Cu—Cu bonding.

This can reduce the number of wires that need to be connected at the via placement portions 221, 222, 261, and 262 (see FIGS. 3 and 4), and thus can reduce the area of the via placement portions 221, 222, 261, and 262.

Consequently, the first modification allows additional effective pixels 310 to be disposed in regions produced by reducing the size of the via placement portions 221, 222, 261, and 262, and thus can improve the resolution of the solid-state imaging device 200.

Furthermore, the first modification, in which the light-receiving circuits 211 and the gradation acquisition circuits 370 are electrically connected by the second connections 371 formed by Cu—Cu bonding, can thus reduce the electrical resistance between the light-receiving circuits 211 and the gradation acquisition circuits 370.

Consequently, signals related to the brightness of light incident on the photodiodes 311 of the light-receiving circuits 211 can be transferred to the gradation acquisition circuits 370 at high speed. Thus, the first modification allows the asynchronous solid-state imaging device 200 to perform higher-speed processing.

Figure 22:
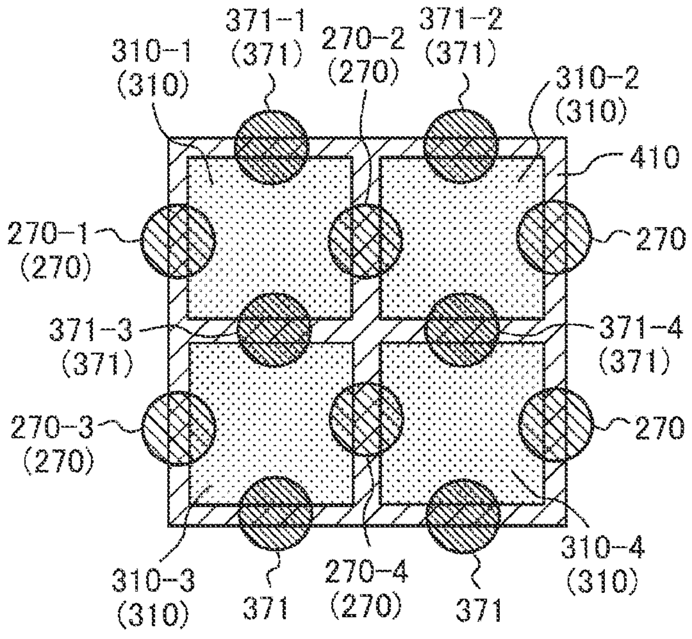
FIG. 22 is a plan view illustrating an arrangement example of the first connections and second connections in the effective pixels according to the first modification of the embodiment of the present disclosure.

FIG. 22 is a plan view illustrating an arrangement example of the first connections 270 and the second connections 371 in the effective pixels 310 according to the first modification of the embodiment of the present disclosure. Note that to facilitate understanding, the first connections 270 and the second connections 371 are illustrated in a circular shape in FIGS. 22 to 24.

In the example of FIG. 22, the first connection 270-1 belonging to the effective pixel 310-1 is placed to overlap one side (the left side in the figure) of the effective pixel 310-1 and also overlap the pixel separation portion 410 in contact with this side of the effective pixel 310-1 in a planar view.

Furthermore, a second connection 371-1 belonging to the effective pixel 310-1 is placed to overlap a different side (the upper side in the figure) of the effective pixel 310-1 and also overlap the pixel separation portion 410 in contact with this different side of the effective pixel 310-1 in a planar view.

Likewise, in the example of FIG. 22, the first connection 270-2 belonging to the effective pixel 310-2 is placed to overlap one side (the left side in the figure) of the effective pixel 310-2 and also overlap the pixel separation portion 410 in contact with this side of the effective pixel 310-2 in a planar view.

Moreover, a second connection 371-2 belonging to the effective pixel 310-2 is placed to overlap a different side (the upper side in the figure) of the effective pixel 310-2 and also overlap the pixel separation portion 410 in contact with this different side of the effective pixel 310-2 in a planar view.

Furthermore, the first connection 270-3 belonging to the effective pixel 310-3 is placed to overlap one side (the left side in the figure) of the effective pixel 310-3 and also overlap the pixel separation portion 410 in contact with this side of the effective pixel 310-3 in a planar view.

Moreover, a second connection 371-3 belonging to the effective pixel 310-3 is placed to overlap a different side (the upper side in the figure) of the effective pixel 310-3 and also overlap the pixel separation portion 410 in contact with this different side of the effective pixel 310-3 in a planar view.

Furthermore, the first connection 270-4 belonging to the effective pixel 310-4 is placed to overlap one side (the left side in the figure) of the effective pixel 310-4 and also overlap the pixel separation portion 410 in contact with this side of the effective pixel 310-4 in a planar view.

Moreover, a second connection 371-4 belonging to the effective pixel 310-4 is placed to overlap a different side (the upper side in the figure) of the effective pixel 310-4 and also overlap the pixel separation portion 410 in contact with this different side of the effective pixel 310-4 in a planar view.

Figure 23:
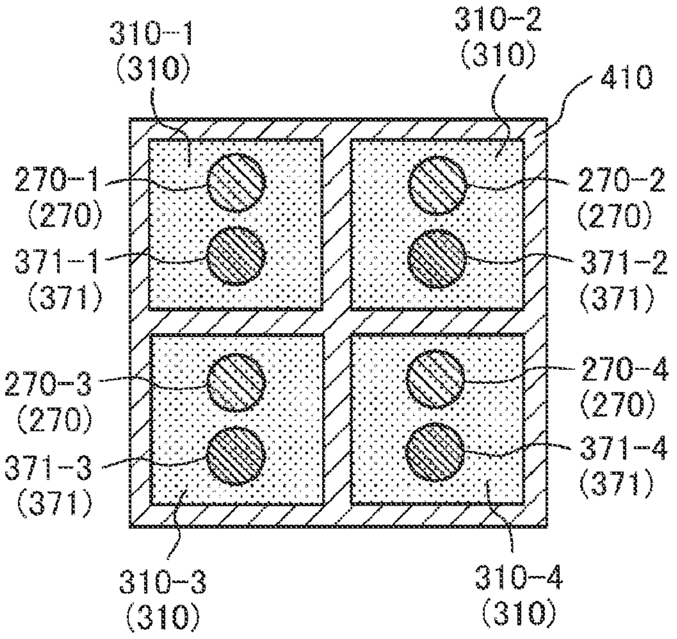
FIG. 23 is a plan view illustrating another arrangement example of the first connections and the second connections in the effective pixels according to the first modification of the embodiment of the present disclosure.

Note that the arrangement of the first connections 270 and the second connections 371 in the effective pixels 310 is not limited to the example of FIG. 22. FIG. 23 is a plan view illustrating another arrangement example of the first connections 270 in the effective pixels 310 according to the first modification of the embodiment of the present disclosure.

In the example of FIG. 23, the first connection 270-1 and the second connection 371-1 belonging to the effective pixel 310-1 are placed on the effective pixel 310-1 without overlapping the pixel separation portions 410 in contact with the effective pixel 310-1 in a planar view.

Likewise, in the example of FIG. 23, the first connection 270-2 and the second connection 371-2 belonging to the effective pixel 310-2 are placed on the effective pixel 310-2 without overlapping the pixel separation portions 410 in contact with the effective pixel 310-2 in a planar view.

Furthermore, the first connection 270-3 and the second connection 371-3 belonging to the effective pixel 310-3 are placed on the effective pixel 310-3 without overlapping the pixel separation portions 410 in contact with the effective pixel 310-3 in a planar view.

Furthermore, the first connection 270-4 and the second connection 371-4 belonging to the effective pixel 310-4 are placed on the effective pixel 310-4 without overlapping the pixel separation portions 410 in contact with the effective pixel 310-4 in a planar view.

Figure 24:
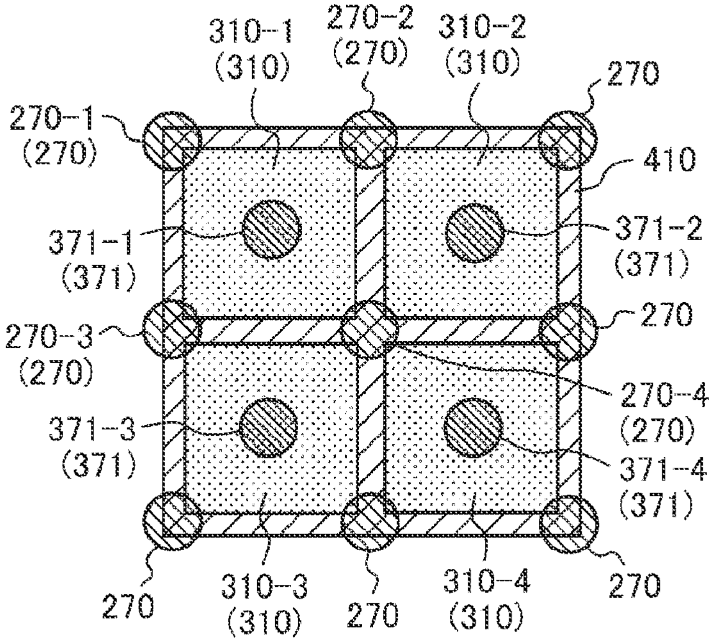
FIG. 24 is a plan view illustrating another arrangement example of the first connections and the second connections in the effective pixels according to the first modification of the embodiment of the present disclosure.

FIG. 24 is a plan view illustrating another arrangement example of the first connections 270 and the second connections 371 in the effective pixels 310 according to the first modification of the embodiment of the present disclosure. In the example of FIG. 24, the first connection 270-1 belonging to the effective pixel 310-1 is placed to overlap a corner portion (an upper left corner portion in the figure) of the effective pixel 310-1 and also overlap the pixel separation portions 410 in contact with this corner portion of the effective pixel 310-1 in a planar view.

Furthermore, the second connection 371-1 belonging to the effective pixel 310-1 is placed on the effective pixel 310-1 without overlapping the pixel separation portions 410 in contact with the effective pixel 310-1 in a planar view.

Likewise, in the example of FIG. 24, the first connection 270-2 belonging to the effective pixel 310-2 is placed to overlap a corner portion (an upper left corner portion in the figure) of the effective pixel 310-2 and also overlap the pixel separation portions 410 in contact with this corner portion of the effective pixel 310-2 in a planar view.

Moreover, the second connection 371-2 belonging to the effective pixel 310-2 is placed on the effective pixel 310-2 without overlapping the pixel separation portions 410 in contact with the effective pixel 310-2 in a planar view.

Furthermore, the first connection 270-3 belonging to the effective pixel 310-3 is placed to overlap a corner portion (an upper left corner portion in the figure) of the effective pixel 310-3 and also overlap the pixel separation portions 410 in contact with this corner portion of the effective pixel 310-3 in a planar view.

Moreover, the second connection 371-3 belonging to the effective pixel 310-3 is placed on the effective pixel 310-3 without overlapping the pixel separation portions 410 in contact with the effective pixel 310-3 in a planar view.

Furthermore, the first connection 270-4 belonging to the effective pixel 310-4 is placed to overlap a corner portion (an upper left corner portion in the figure) of the effective pixel 310-4 and also overlap the pixel separation portions 410 in contact with this corner portion of the effective pixel 310-4 in a planar view.

Moreover, the second connection 371-4 belonging to the effective pixel 310-4 is placed on the effective pixel 310-4 without overlapping the pixel separation portions 410 in contact with the effective pixel 310-3 in a planar view.

Note that in the examples of FIGS. 22 to 24, the first connection 270 and the second connection 371 belonging to each effective pixel 310 may change places.

Figure 25:
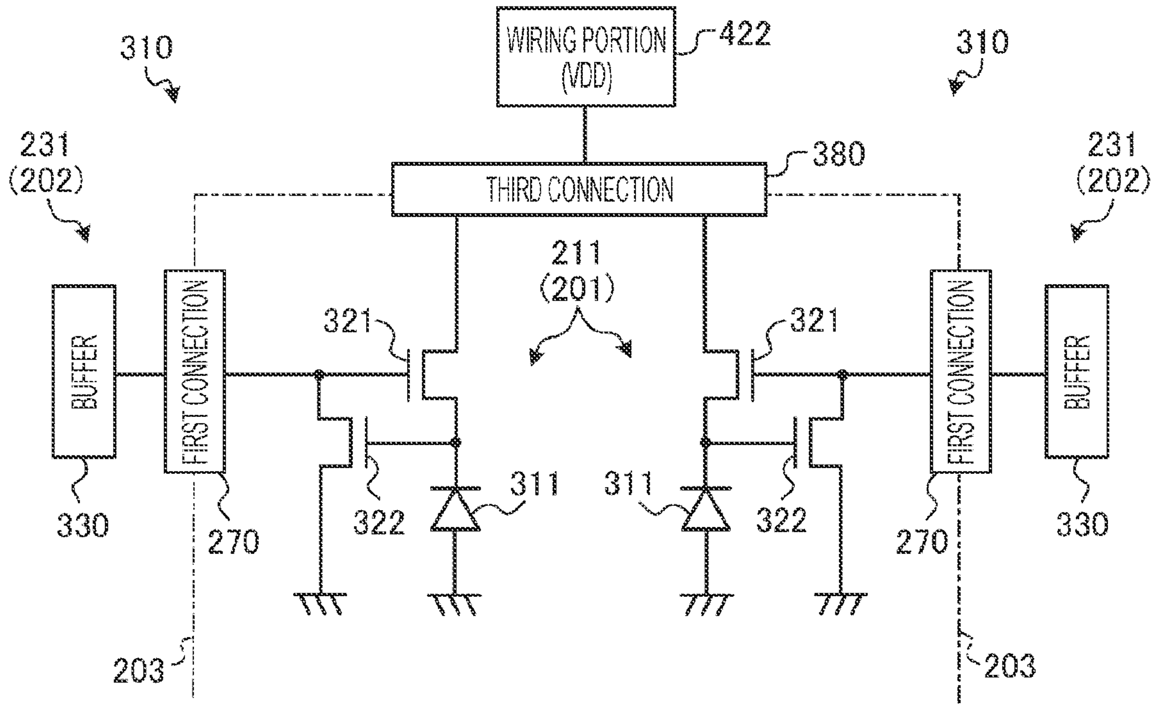
FIG. 25 is a diagram illustrating a circuit configuration of the effective pixel according to a second modification of the embodiment of the present disclosure.

FIG. 25 is a diagram illustrating a circuit configuration of the effective pixels 310 according to a second modification of the embodiment of the present disclosure. As illustrated in FIG. 25, the second modification is different from the embodiment in that the drains of the N-type transistors 321 belonging to two or more effective pixels 310 are connected to the power supply wiring 422 (i.e. the power supply voltage VDD) via the same third connection 380.

The third connection 380 includes a first pad and a second pad (not illustrated).

The first pad is provided to be exposed at the surface of the light-receiving substrate 201 opposite to the light incidence side surface (i.e. the interface with the circuit board 202), and includes copper or a copper alloy.

Furthermore, the second pad is provided to be exposed at the light incidence side surface of the circuit board 202 (i.e. the interface with the light-receiving substrate 201), and includes copper or a copper alloy.

In the second modification, the first pad and the second pad are directly bonded together by Cu—Cu bonding to form the third connection 380. Furthermore, in the second modification, one third connection 380 is shared by two or more (two in the figure) effective pixels 310.

Thus, in the second modification, the drains of the N-type transistors 321 and the power supply wiring 422 are electrically connected by the third connection 380 formed by Cu—Cu bonding.

This can reduce the number of wires that need to be connected at the via placement portions 221, 222, 261, and 262 (see FIGS. 3 and 4), and thus can reduce the area of the via placement portions 221, 222, 261, and 262.

Consequently, the second modification allows additional effective pixels 310 to be disposed in regions produced by reducing the size of the via placement portions 221, 222, 261, and 262, and thus can improve the resolution of the solid-state imaging device 200.

Furthermore, the second modification, in which two or more effective pixels 310 share one third connection 380, can thus reduce the number of third connections 380 in the solid-state imaging device 200. Consequently, the second modification can facilitate the placement of connections (the first connections 270 and the second connections 371) different from the third connections 380 at the joint 203.

Note that in the example of FIG. 25, an example in which one third connection 380 is shared by two effective pixels 310 has been described, but three or more effective pixels 310 may share one third connection 380.

Figure 26:
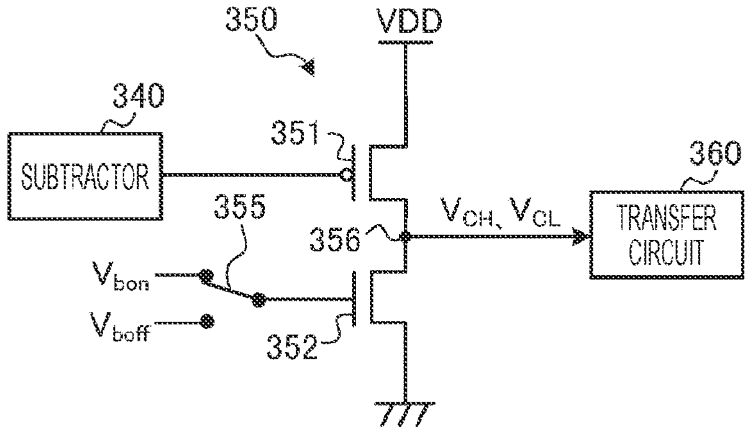
FIG. 26 is a diagram illustrating a circuit configuration of the effective pixel according to a third modification of the embodiment of the present disclosure.

FIG. 26 is a diagram illustrating a circuit configuration of the effective pixels 310 according to a third modification of the embodiment of the present disclosure, and illustrates the quantizer 350 that detects the presence or absence of a selected one of the on event and the off event.

The quantizer 350 according to the third modification includes the P-type transistor 351, the N-type transistor 352, and a switch 355. The P-type transistor 351 and the N-type transistor 352 are connected in series in this order between the terminal of the power supply voltage VDD and the terminal of the ground potential.

Furthermore, the gate of the P-type transistor 351 is connected to the output terminal of the subtractor 340. The gate of the N-type transistor 352 is connected to the switch 355.

Then, by switching the switch 355, the control unit 130 can apply the bias voltage $V_{bon}$ indicating the upper threshold value or the bias voltage $V_{boff}$ indicating the lower threshold value to the gate of the N-type transistor 352. A connection point 356 between the P-type transistor 351 and the N-type transistor 352 is connected to the transfer circuit 360.

Thus, when the bias voltage $V_{bon}$ is applied to the gate of the N-type transistor 352 in the quantizer 350 according to the third modification, the voltage at the connection point 356 is output to the transfer circuit 360 as the on event detection signal $V_{CH}$.

On the other hand, when the bias voltage $V_{boff}$ is applied to the gate of the N-type transistor 352 in the quantizer 350 according to the third modification, the voltage at the connection point 356 is output to the transfer circuit 360 as the off event detection signal $V_{CL}$.

With this configuration, in a case where the on event is selected by the control unit 130, the quantizer 350 according to the third modification outputs the on event detection signal $V_{CH}$ at a high level when the differential signal exceeds the upper threshold value.

On the other hand, in a case where the off event is selected by the control unit 130, the quantizer 350 according to the third modification outputs the off event detection signal $V_{CL}$ at a low level when the differential signal falls below the lower threshold value.

For example, when a light source (not illustrated) is turned on by a command from the control unit 130 or the like, the control unit 130 selects the on event, so that the solid-state imaging device 200 according to the third modification can efficiently output the on event detection signal $V_{CH}$.

Furthermore, when a light source (not illustrated) is turned off by a command from the control unit 130 or the like, the control unit 130 selects the off event, so that the solid-state imaging device 200 according to the third modification can efficiently output the off event detection signal $V_{CL}$.

The third modification described above can reduce the number of transistors constituting the quantizer 350, and thus can reduce the chip area of the solid-state imaging device 200 and can reduce the power consumption of the solid-state imaging device 200.

Effects

The solid-state imaging device 200 according to the embodiment includes the light-receiving substrate 201, the circuit board 202, and the plurality of first connections 270. The light-receiving substrate 201 includes the plurality of light-receiving circuits 211 provided with the photoelectric conversion elements (photodiodes 311). The circuit board 202 is directly bonded to the light-receiving substrate 201 and includes the plurality of address event detection circuits 231 that detects individual changes in voltages output from the photoelectric conversion elements (photodiodes 311) of the plurality of light-receiving circuits 211. The plurality of first connections 270 is provided at the joint 203 between the light-receiving substrate 201 and the circuit board 202 to electrically connect the light-receiving circuits 211 and the address event detection circuits 231 corresponding to each other.

This can improve the resolution of the solid-state imaging device 200.

Furthermore, in the solid-state imaging device 200 according to the embodiment, the plurality of first connections 270 is located between the plurality of light-receiving circuits 211 and the plurality of address event detection circuits 231 corresponding to each other.

Thus, the asynchronous solid-state imaging device 200 can perform higher-speed processing.

Furthermore, in the solid-state imaging device 200 according to the embodiment, at least one of the plurality of first connections 270 includes the first pad 403 formed at the bonding plane of the light-receiving substrate 201 and the second pad 404 formed at the bonding plane of the circuit board 202. Then, the first pad 403 and the second pad 404 include the same material.

This allows the plurality of first connections 270 in the solid-state imaging device 200 to be formed in one process step.

Furthermore, in the solid-state imaging device 200 according to the embodiment, the first pads 403 and the second pads 404 are directly bonded together.

This allows the plurality of first connections 270 in the solid-state imaging device 200 to be formed in one process step.

Furthermore, in the solid-state imaging device 200 according to the embodiment, the circuit board 202 includes the plurality of gradation acquisition circuits 370 that acquires individual gradations in light incident on the photoelectric conversion elements (photodiodes 311) of the plurality of light-receiving circuits 211. Then, the solid-state imaging device 200 according to the embodiment includes the plurality of second connections 371 provided at the joint 203 between the light-receiving substrate 201 and the circuit board 202 to electrically connect the light-receiving circuits 211 and the gradation acquisition circuits 370 corresponding to each other.

This can improve the resolution of the solid-state imaging device 200.

Furthermore, the solid-state imaging device 200 according to the embodiment includes the plurality of third connections 380 provided at the joint 203 between the light-receiving substrate 201 and the circuit board 202 to connect the photoelectric conversion elements (photodiodes 311) and the power supply voltage VDD. Then, at least one of the plurality of third connections 380 is shared by two or more photoelectric conversion elements (photodiodes 311).

This can facilitate the placement of connections (the first connections 270 and the second connections 371) different from the third connections 380 at the joint 203.

[Second Configuration Example of Address Event Detection Unit]

Figure 27:
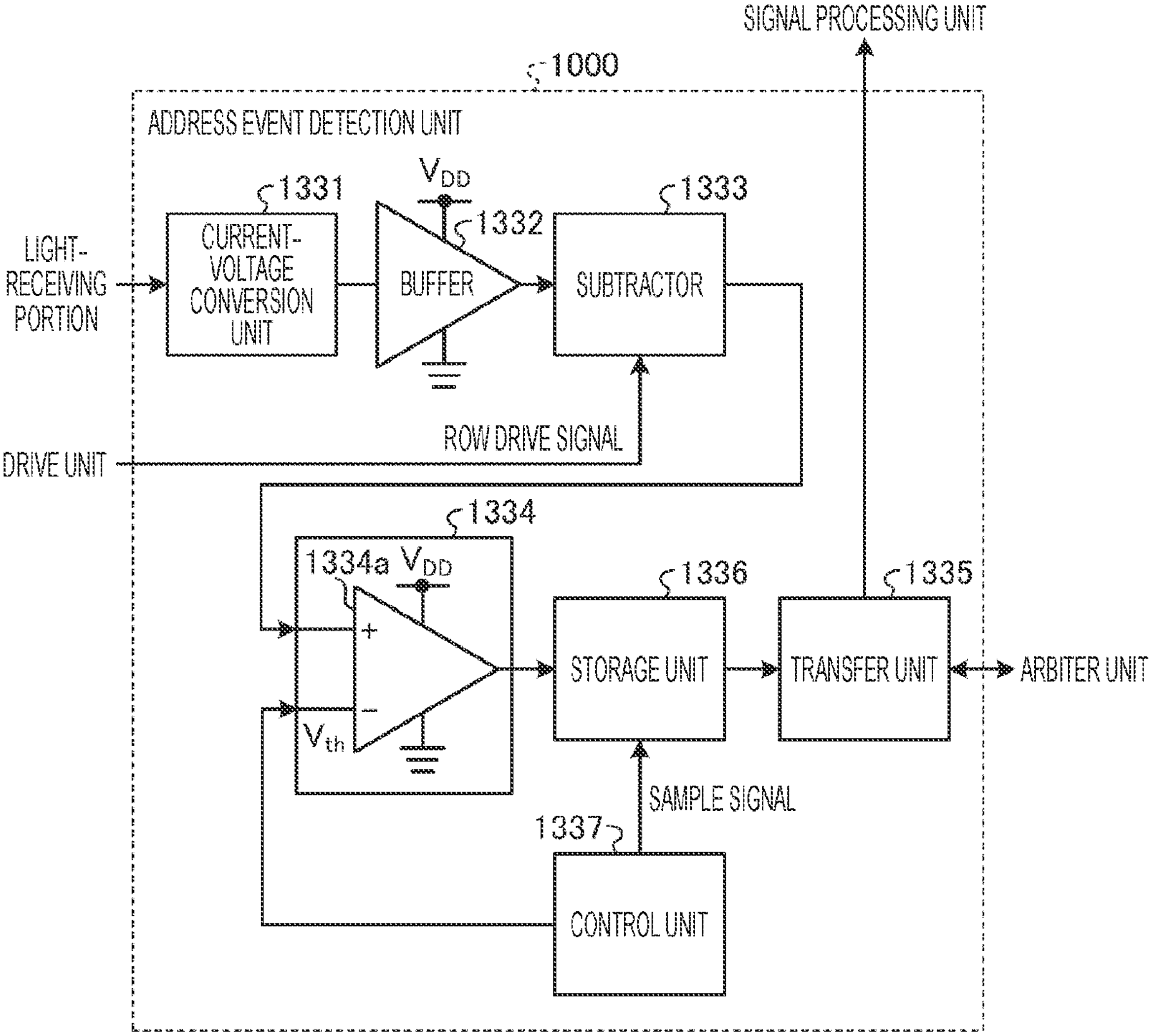
FIG. 27 is a block diagram illustrating a second configuration example of an address event detection unit.

FIG. 27 is a block diagram illustrating a second configuration example of an address event detection unit 1000. As illustrated in FIG. 27, the address event detection unit 1000 according to the present configuration example includes a storage unit 1336 and a control unit 1337 in addition to a current-voltage conversion unit 1331, a buffer 1332, a subtractor 1333, a quantizer 1334, and a transfer unit 1335.

The storage unit 1336 is provided between the quantizer 1334 and the transfer unit 1335, and stores the output of the quantizer 1334, that is, the result of comparison by a comparator 1334*a* on the basis of a sample signal provided from the control unit 1337. The storage unit 1336 may be a sampling circuit such as a switch, plastic, or capacity or may be a digital memory circuit such as a latch or a flip-flop.

The control unit 1337 supplies a predetermined threshold voltage Vth to the inverting (−) input terminal of the comparator 1334*a*. The threshold voltage Vth supplied from the control unit 1337 to the comparator 1334*a* may have voltage values varying in a time division manner. For example, the control unit 1337 supplies a threshold voltage Vth1 corresponding to the on event indicating that the amount of change in photocurrent has exceeded the upper threshold value and a threshold voltage Vth2 corresponding to the off event indicating that the amount of change has fallen below the lower threshold value at different timings, thereby allowing the single comparator 1334*a* to detect two or more types of address events.

For example, the storage unit 1336 may store the result of comparison by the comparator 1334*a* using the threshold voltage Vth1 corresponding to the on event during a period in which the threshold voltage Vth2 corresponding to the off event is supplied from the control unit 1337 to the inverting (−) input terminal of the comparator 1334*a*. Note that the storage unit 1336 may be located inside each pixel 2030 (see FIG. 28) or outside each pixel 2030. Furthermore, the storage unit 1336 is not an essential component of the address event detection unit 1000. That is, the storage unit 1336 may be omitted.

[Imaging Apparatus (Scan Method) According to Second Configuration Example]

The imaging apparatus 100 according to the first configuration example described above is an asynchronous imaging apparatus that reads events by an asynchronous reading method. However, the event reading method is not limited to the asynchronous reading method, and may be a synchronous reading method. An imaging apparatus to which the synchronous reading method is applied is a scanning imaging apparatus, which is the same as a typical imaging apparatus that performs imaging at a predetermined frame rate.

Figure 28:
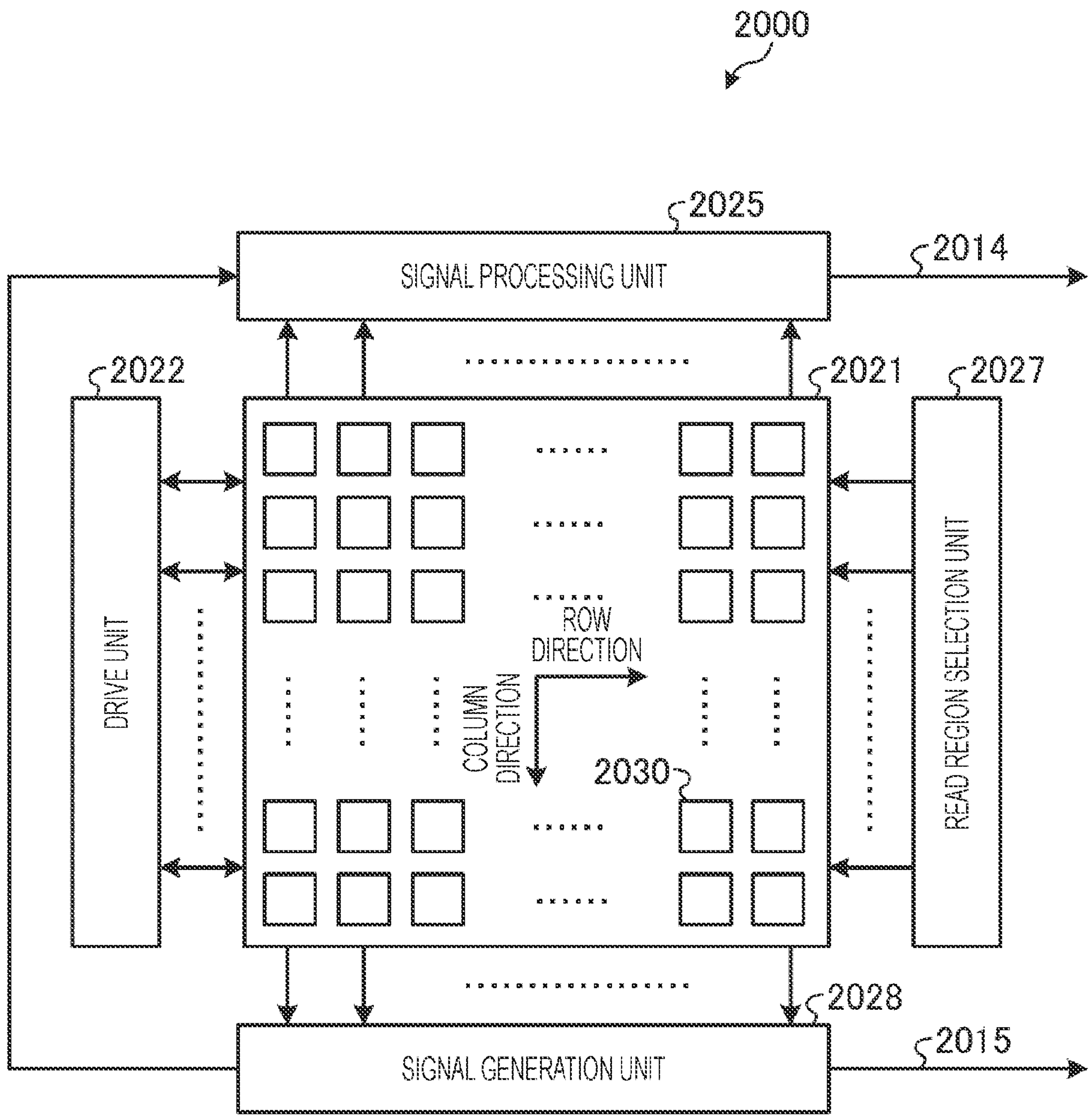
FIG. 28 is a block diagram illustrating an example of a configuration of an imaging apparatus according to a second configuration example, that is, a scanning imaging apparatus used as an imaging apparatus in an imaging system to which a technology according to the present disclosure is applied.

FIG. 28 is a block diagram illustrating an example of a configuration of an imaging apparatus according to a second configuration example, that is, a scanning imaging apparatus used as an imaging apparatus 2000 in an imaging system to which the technology according to the present disclosure is applied.

As illustrated in FIG. 28, the imaging apparatus 2000 according to the second configuration example as the imaging apparatus of the present disclosure includes a pixel array 2021, a drive unit 2022, a signal processing unit 2025, a read region selection unit 2027, and a signal generation unit 2028.

The pixel array 2021 includes a plurality of pixels 2030. The plurality of pixels 2030 outputs an output signal in response to a selection signal from the read region selection unit 2027. Each of the plurality of pixels 2030 may include a quantizer comparator in the pixel. The plurality of pixels

2030 outputs an output signal corresponding to the amount of change in the intensity of light. The plurality of pixels 2030 may be two-dimensionally arranged in a matrix as illustrated in FIG. 28.

The drive unit 2022 drives each of the plurality of pixels 2030 to cause a pixel signal generated in each pixel 2030 to be output to the signal processing unit 2025. Note that the drive unit 2022 and the signal processing unit 2025 are circuit portions for acquiring gradation information. Thus, in a case where only event information is acquired, the drive unit 2022 and the signal processing unit 2025 may be removed.

The read region selection unit 2027 selects some of the plurality of pixels 2030 included in the pixel array 2021. Specifically, the read region selection unit 2027 determines a selected region in response to a request from each pixel 2030 of the pixel array 2021. For example, the read region selection unit 2027 selects one or two or more rows of the rows included in the structure of the two-dimensional matrix corresponding to the pixel array 2021. The read region selection unit 2027 sequentially selects one or two or more rows according to a preset cycle. Furthermore, the read region selection unit 2027 may determine a selected region in response to a request from each pixel 2030 of the pixel array 2021.

On the basis of output signals from pixels selected by the read region selection unit 2027, the signal generation unit 2028 generates an event signal for an active pixel of the selected pixels for which an event has been detected. The event is an event in which the intensity of light changes. The active pixel is a pixel in which the amount of change in the intensity of light corresponding to the output signal exceeds or falls below a preset threshold value. For example, the signal generation unit 2028 compares the output signals of the pixels with a reference signal, detects an active pixel that outputs the output signal if it is larger or smaller than the reference signal, and generates an event signal for the active pixel.

The signal generation unit 2028 may include, for example, a column selection circuit that arbitrates between signals entering the signal generation unit 2028. Furthermore, the signal generation unit 2028 may not only output information on an active pixel for which an event has been detected but also output information on an inactive pixel for which an event has not been detected.

Address information and time stamp information (e.g., (X, Y, T)) on an active pixel for which an event has been detected are output from the signal generation unit 2028 through an output line 2015. However, data output from the signal generation unit 2028 may be not only the address information and the time stamp information but also information in a frame format (e.g., (0, 0, 1, 0, . . . )).

[Distance-Measuring System]

A distance-measuring system according to an embodiment of the present disclosure is a system for measuring a distance to a subject, using structured light technology. Furthermore, the distance-measuring system according to the embodiment of the present disclosure may also be used as a system that acquires three-dimensional (3D) images, and in this case, can be referred to as a three-dimensional image acquisition system. Structured light measures a distance by identifying the coordinates of a point image with a light source (so-called point light source) from which the point image has been projected by pattern matching.

Figure 29:
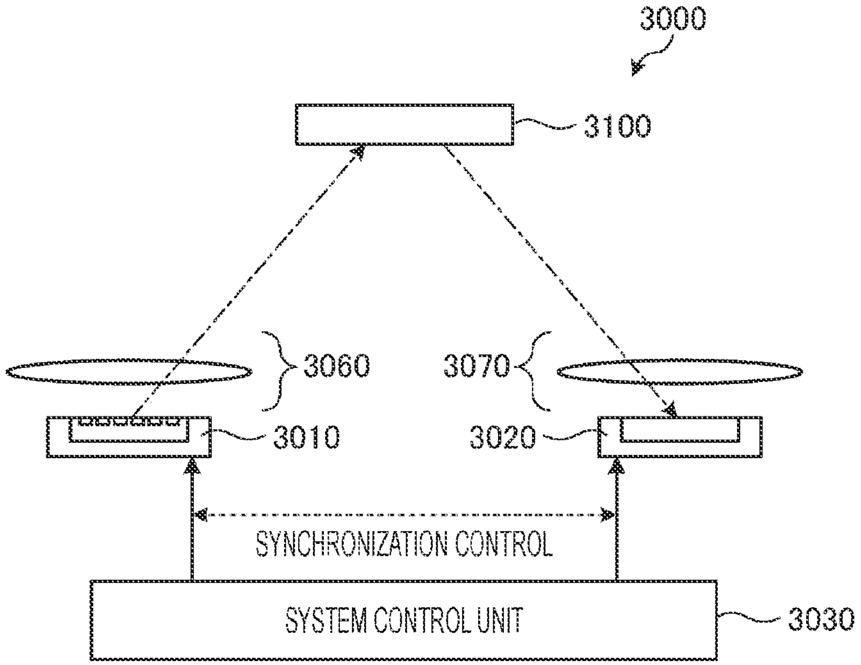
FIG. 29 is a schematic diagram illustrating an example of a configuration of a distance-measuring system according to an embodiment of the present disclosure.
Figure 30:
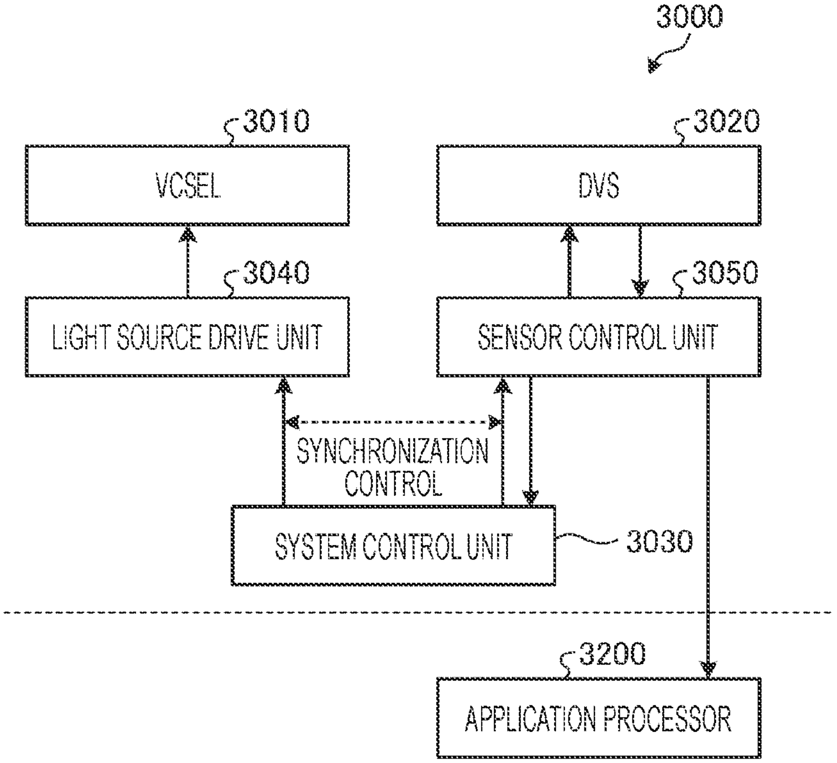
FIG. 30 is a block diagram illustrating an example of a circuit configuration.

FIG. 29 is a schematic diagram illustrating an example of a configuration of the distance-measuring system according to the embodiment of the present disclosure. FIG. 30 is a block diagram illustrating an example of a circuit configuration.

A distance-measuring system 3000 according to the present embodiment uses a surface-emitting semiconductor laser, for example, a vertical-cavity surface-emitting laser (VCSEL) 3010 as a light source unit, and uses an event detection sensor 3020 called a DVS as a light-receiving portion. The vertical-cavity surface-emitting laser (VCSEL) 3010 projects a predetermined pattern of light onto a subject. The distance-measuring system 3000 according to the present embodiment includes a system control unit 3030, a light source drive unit 3040, a sensor control unit 3050, a light source side optical system 3060, and a camera side optical system 3070 in addition to the vertical-cavity surface-emitting laser 3010 and the event detection sensor 3020.

The system control unit 3030 includes, for example, a processor (CPU), drives the vertical-cavity surface-emitting laser 3010 via the light source drive unit 3040, and drives the event detection sensor 3020 via the sensor control unit 3050. More specifically, the system control unit 3030 synchronizes and controls the vertical-cavity surface-emitting laser 3010 and the event detection sensor 3020.

In the distance-measuring system 3000 according to the present embodiment of the above configuration, the predetermined pattern of light emitted from the vertical-cavity surface-emitting laser 3010 is projected onto a subject (object to be measured) 3100 through the light source side optical system 3060. The projected light is reflected off the subject 3100. Then, the light reflected off the subject 3100 enters the event detection sensor 3020 through the camera side optical system 3070. The event detection sensor 3020 receives the light reflected off the subject 3100, and detects a change in brightness of a pixel exceeding a predetermined threshold as an event. Event information detected by the event detection sensor 3020 is provided to an application processor 3200 outside the distance-measuring system 3000. The application processor 3200 performs predetermined processing on the event information detected by the event detection sensor 3020.

Although the embodiments of the present disclosure have been described above, the technical scope of the present disclosure is not limited to the above-described embodiments as they are, and various modifications can be made without departing from the scope of the present disclosure. Furthermore, components of the different embodiments and modifications may be appropriately combined.

Furthermore, the effects described in the present description are merely examples and nonlimiting, and other effects may be included.

Note that the present technology can also have the following configurations.

(1)

A solid-state imaging device including:

a light-receiving substrate including a plurality of light-receiving circuits provided with photoelectric conversion elements;

a circuit board that is directly bonded to the light-receiving substrate and includes a plurality of address event detection circuits that detects individual changes in voltages output from the photoelectric conversion elements of the plurality of light-receiving circuits; and a plurality of first connections provided at a joint between the light-receiving substrate and the circuit board to electrically connect the light-receiving circuits and the address event detection circuits corresponding to each other.

(2)

The solid-state imaging device according to (1) above, in which the plurality of first connections is located between the plurality of light-receiving circuits and the plurality of address event detection circuits corresponding to each other.

(3)

The solid-state imaging device according to (1) or (2) above, in which at least one of the plurality of first connections includes a first pad formed at a bonding plane of the light-receiving substrate and a second pad formed at a bonding plane of the circuit board, and the first pad and the second pad include the same material.

(4)

The solid-state imaging device according to (3) above, in which the first pad and the second pad are directly bonded together.

(5)

The solid-state imaging device according to any one of (1) to (4) above, in which the circuit board further includes a plurality of gradation acquisition circuits that acquires individual gradations in light incident on the photoelectric conversion elements of the plurality of light-receiving circuits, and the solid-state imaging device further includes a plurality of second connections provided at the joint between the light-receiving substrate and the circuit board to electrically connect the light-receiving circuits and the gradation acquisition circuits corresponding to each other.

(6)

The solid-state imaging device according to any one of (1) to (5) above, further including:

a plurality of third connections provided at the joint between the light-receiving substrate and the circuit board to connect the photoelectric conversion elements and a power supply voltage, at least one of the plurality of third connections being shared by two or more of the photoelectric conversion elements.

(7)

An imaging apparatus including:

a lens;

a solid-state imaging device; and a control unit that controls the solid-state imaging device, in which the solid-state imaging device includes a light-receiving substrate including a plurality of light-receiving circuits provided with photoelectric conversion elements, a circuit board that is directly bonded to the light-receiving substrate and includes a plurality of address event detection circuits that detects individual changes in voltages output from the photoelectric conversion elements of the plurality of light-receiving circuits, a plurality of connections provided at a joint between the light-receiving substrate and the circuit board to electrically connect the light-receiving circuits and the address event detection circuits corresponding to each other, and a signal processing unit that performs signal processing on output of the solid-state imaging device.

(8)

The imaging apparatus according to (7) above, in which the plurality of first connections is located between the plurality of light-receiving circuits and the plurality of address event detection circuits corresponding to each other.

(9)

The imaging apparatus according to (7) or (8) above, in which at least one of the plurality of first connections includes a first pad formed at a bonding plane of the light-receiving substrate and a second pad formed at a bonding plane of the circuit board, and the first pad and the second pad include the same material.

(10)

The imaging apparatus according to (9) above, in which the first pad and the second pad are directly bonded together.

(11)

The imaging apparatus according to any one of (7) to (10) above, in which the circuit board further includes a plurality of gradation acquisition circuits that acquires individual gradations in light incident on the photoelectric conversion elements of the plurality of light-receiving circuits, and the imaging apparatus further includes a plurality of second connections provided at the joint between the light-receiving substrate and the circuit board to electrically connect the light-receiving circuits and the gradation acquisition circuits corresponding to each other.

(12)

The imaging apparatus according to any one of (7) to (11) above, further including:

a plurality of third connections provided at the joint between the light-receiving substrate and the circuit board to connect the photoelectric conversion elements and a power supply voltage, at least one of the plurality of third connections being shared by two or more of the photoelectric conversion elements.

REFERENCE SIGNS LIST

100 Imaging apparatus
110 Lens
130 Control unit
200 Solid-state imaging device
201 Light-receiving substrate
202 Circuit board
203 Joint
211 Light-receiving circuit
231 Address event detection circuit
270, 270-1 to 270-4 First connection
310 Effective pixel
311 Photodiode (an example of photoelectric conversion element)
371, 371-1 to 371-4 Second connection
380 Third connection
403 First pad
404 Second pad

What is claimed is:

1. A solid-state imaging device, comprising:

a light-receiving substrate including a plurality of light-receiving circuits provided with photoelectric conversion elements;

a circuit board that is directly bonded to and entirely in direct contact with the light-receiving substrate, and includes a plurality of address event detection circuits that detect individual changes in voltages output from the photoelectric conversion elements of the plurality of light-receiving circuits, wherein at least some of the photoelectric conversion elements that output voltages to the address event detection circuits are directly adjacent to other of the photoelectric conversion elements that output voltages to the address event detection circuits; and a plurality of first connections provided at a joint between the light-receiving substrate and the circuit board to electrically connect the light-receiving circuits and the address event detection circuits corresponding to each other, wherein at least one of the plurality of first connections includes a first pad of a first material of the light-receiving substrate that is directly bonded to a second pad of the first material of the circuit board.

2. The solid-state imaging device according to claim 1, wherein the plurality of first connections is located between the plurality of light-receiving circuits and the plurality of address event detection circuits corresponding to each other.

3. The solid-state imaging device according to claim 1, wherein the first pad is formed at a bonding plane of the light-receiving substrate and the second pad is formed at a bonding plane of the circuit board.

4. The solid-state imaging device according to claim 1, wherein the circuit board further includes a plurality of gradation acquisition circuits that acquires individual gradations in light incident on the photoelectric conversion elements of the plurality of light-receiving circuits, and the solid-state imaging device further comprises a plurality of second connections provided at the joint between the light-receiving substrate and the circuit board to electrically connect the light-receiving circuits and the gradation acquisition circuits corresponding to each other.

5. The solid-state imaging device according to claim 1, further comprising:

a plurality of third connections provided at the joint between the light-receiving substrate and the circuit board to connect the photoelectric conversion elements and a power supply voltage, wherein at least one of the plurality of third connections is shared by two or more of the photoelectric conversion elements.

6. An imaging apparatus comprising:

a lens;

a solid-state imaging device; and circuitry configured to control the solid-state imaging device, wherein the solid-state imaging device includes a light-receiving substrate including a plurality of light-receiving circuits provided with photoelectric conversion elements, a circuit board that is directly bonded to and entirely in direct contact with the light-receiving substrate and includes a plurality of address event detection circuits that detect individual changes in voltages output from the photoelectric conversion elements of the plurality of light-receiving circuits, wherein at least some of the photoelectric conversion elements that output voltages to the address event detection circuits are directly adjacent to other of the photoelectric conversion elements that output voltages to the address event detection circuits, a plurality of first connections provided at a joint between the light-receiving substrate and the circuit board to electrically connect the light-receiving circuits and the address event detection circuits corresponding to each other, wherein at least one of the plurality of first connections includes a first pad of a first material of the light-receiving substrate that is directly bonded to a second pad of the first material of the circuit board, and signal processing circuitry configured to perform signal processing on output of the solid-state imaging device.

7. The imaging apparatus according to claim 6, wherein the plurality of first connections is located between the plurality of light-receiving circuits and the plurality of address event detection circuits corresponding to each other.

8. The imaging apparatus according to claim 6, wherein the first pad is formed at a bonding plane of the light-receiving substrate and the second pad formed at a bonding plane of the circuit board.

9. The imaging apparatus according to claim 6, wherein the circuit board further includes a plurality of gradation acquisition circuits that acquires individual gradations in light incident on the photoelectric conversion elements of the plurality of light-receiving circuits, and the imaging apparatus further comprises a plurality of second connections provided at the joint between the light-receiving substrate and the circuit board to electrically connect the light-receiving circuits and the gradation acquisition circuits corresponding to each other.

10. The imaging apparatus according to claim 6, further comprising:

a plurality of third connections provided at the joint between the light-receiving substrate and the circuit board to connect the photoelectric conversion elements and a power supply voltage, wherein at least one of the plurality of third connections is shared by two or more of the photoelectric conversion elements.

* * * * *